(12) United States Patent
Gogoi

(10) Patent No.: US 7,812,454 B2
(45) Date of Patent: Oct. 12, 2010

(54) SEMICONDUCTOR STRUCTURE AND METHOD OF MANUFACTURE

(75) Inventor: Bishnu Prasanna Gogoi, Scottsdale, AZ (US)

(73) Assignee: HVVi Semiconductors, Inc, Phoenix, AZ (US)

( * ) Notice: Subject to any disclaimer, the term of this patent is extended or adjusted under 35 U.S.C. 154(b) by 0 days.

(21) Appl. No.: 12/208,630

(22) Filed: Sep. 11, 2008

(65) Prior Publication Data
US 2009/0108458 A1 Apr. 30, 2009

Related U.S. Application Data

(60) Provisional application No. 60/983,064, filed on Oct. 26, 2007.

(51) Int. Cl.
*H01L 23/48* (2006.01)
(52) U.S. Cl. .................. 257/773; 257/765; 257/767
(58) Field of Classification Search .......... 257/773, 257/765, 767
See application file for complete search history.

(56) References Cited

U.S. PATENT DOCUMENTS 6,200,894 B1 * 3/2001 Licata et al. ............ 438/688

| | | | |
|---|---|---|---|
| 2002/0081835 A1 | 6/2002 | Park et al. | |
| 2004/0155287 A1 * | 8/2004 | Omura et al. | 257/328 |
| 2006/0197154 A1 * | 9/2006 | Pelella et al. | 257/347 |

FOREIGN PATENT DOCUMENTS

| JP | 57160142 A | 10/1982 |
|---|---|---|
| WO | 2009/055156 A1 | 4/2009 |

OTHER PUBLICATIONS

"International Search Report/Written Opinion Received for PCT Application No. PCT/US2008/076032 mailed on Jan. 30, 2009", 12 Pages.

International Preliminary Report on Patentability/Written Opinion received for PCT Application No. PCT/US2008/076032, mailed on May 6, 2010, 7 pages.

* cited by examiner

*Primary Examiner*—Long Pham
(74) *Attorney, Agent, or Firm*—Cool Patent, P.C.; Kenneth J. Cool

(57) ABSTRACT

In various embodiments, semiconductor structures and methods to manufacture these structures are disclosed. In one embodiment, an electrical bus embedded in a dielectric material below a surface of a semiconductor substrate is disclosed. Other embodiments are described and claimed.

14 Claims, 14 Drawing Sheets

US 7,812,454 B2

SEMICONDUCTOR STRUCTURE AND METHOD OF MANUFACTURE

CROSS REFERENCE TO RELATED APPLICATION

The present application claims the benefit of U.S. Provisional Application No. 60/983,064 filed Oct. 26, 2007. Said Application No. 60/983,064 is hereby incorporated by reference in its entirety.

TECHNICAL FIELD

Embodiments disclosed in the present disclosure relate generally to electrical and semiconductor technology, and more specifically to a semiconductor structure that includes a dielectric structure.

BACKGROUND

For some applications, such as digital, analog, radio-frequency (RF) or mixed signal circuits, networks of electrically conductive interconnects or busses may be formed to provide distribution of signals or power for common use within the die. In one example the electrically conductive interconnects provide distribution of power to the circuits or transistors across the die. However, these interconnects may have relatively high resistance because of their relatively small cross-sectional area. High resistance interconnects leads to power loss in the interconnect themselves, which produces undesired heat and reduces the overall efficiency. Furthermore, resistive losses result in a reduction in the interconnect voltage with increasing distance from the voltage source. Circuit or transistor operation may thus be compromised because of a variation in power supply voltage across the die.

Further, electrically conductive interconnects may be used to provide distribution of circuit signals that are commonly used across the die. In one example such interconnects may provide distribution of the clock signal. In addition to the issues discussed above relating to high resistance, when formed on or in relatively close proximity to a conductive substrate or other conductive elements, parasitic capacitive coupling may cause a reduction in the frequency of operation or a variation in the frequency of operation across the die, again degrading performance. Such parasitic capacitive coupling may also occur between interconnects or between interconnects and devices.

Further, regions of a semiconductor substrate may be physically and electrically isolated from each other. For example mixed signal circuits may include both analog and digital circuit components as well as optional power components. Each of these sub-components may require isolated distribution of their own signals and power over independent interconnects. When such signal and/or power lines come within close proximity to each other or other conductive components, or cross each other, interaction may occur between them resulting in reduced frequency of operation and/or compromised circuit performance, for example by cross-talk, where a signal from one interconnect is coupled into the signal from another interconnect.

Figure 1:
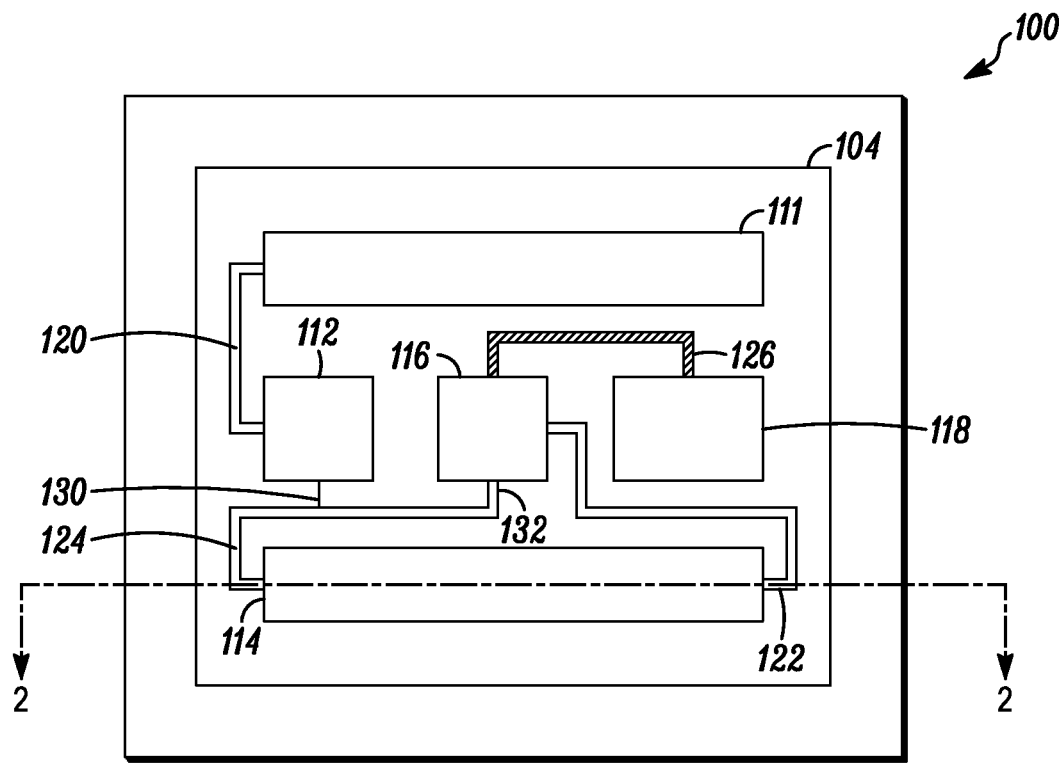
FIG. 1 is a plan view of a semiconductor structure in accordance with an embodiment.

For simplicity of illustration and ease of understanding, elements in the various figures are not necessarily drawn to scale, unless explicitly so stated. Further, if considered appropriate, reference numerals have been repeated among the figures to indicate corresponding and/or analogous elements. In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention that the appended claims be limited by the title, technical field, background, or abstract.

DETAILED DESCRIPTION

In the following description and claims, the terms "comprise" and "include," along with their derivatives, may be used and are intended as synonyms for each other. In addition, in the following description and claims, the terms "coupled" and "connected," along with their derivatives, may be used. "Connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements.

FIG. 1 shows a plan view of a semiconductor structure 100 comprising a dielectric structure 104 and active regions comprising an analog power supply region 111, an analog circuit region 112, a digital power supply region 114, a digital circuit region 116, an interconnect for analog power 120, an interconnect for digital power 122, an interconnect for ground 124, a signal interconnect 126 and a passive element region 118. Dielectric structure 104 may be referred to as a dielectric structure, a dielectric material, a dielectric platform or a dielectric region. Dielectric structure 104 may be formed at least partially below surface 105 (FIG. 2) of substrate 110 and thus may also be referred to as an embedded dielectric structure. Dielectric structure 104 may be comprised mainly of one or more relatively low dielectric constant materials, for example silicon dioxide. In addition, in some embodiments, dielectric structure 104 may include one or more voids or air gaps. Since empty space has the lowest dielectric constant (the dielectric constant of empty space is 1), the more empty space or void space incorporated into dielectric structure 104, the lower the overall or effective dielectric constant of dielectric structure 104.

Ground interconnect 124 may comprise a main interconnect 124 and two branches 130 and 132. Branches 130 and 132 may also be referred to as taps or local tap. As will be discussed later, branches 130 and 132 may couple the main interconnect 124 to an active region or a passive region, here for example branch 130 couples to the analog circuit region 112 and branch 132 couples to the digital circuit region 116.

Active regions 111, 112, 114, 116 may be comprised of a portion of substrate 110. In some embodiments, substrate 110 may be referred to as a device layer or an active layer. Further, in some embodiments, substrate 110 may include one or more epitaxial layers or bonded layers. A portion of substrate 110 may be used as an active area where active devices, such as, for example, transistors or diodes, or portions of active devices, may subsequently formed. Active devices may be formed in active regions 111, 112, 114, 116 using conventional MOS (metal oxide semiconductor), complementary metal oxide semiconductor (CMOS), bipolar, or bipolar-CMOS (BiCMOS) processes. The active regions may also be referred to as circuit sections, subsections, sub-circuits, active areas or active area regions or portions of active areas.

Passive devices may be formed in passive region 118 over dielectric structure 104 using conventional semiconductor processing. Examples of passive devices may include capacitors, inductors, and resistors or interconnects.

Substrate 110 may comprise a semiconductor material such as, for example, silicon, and may be doped or undoped depending on the application.

Figure 2:
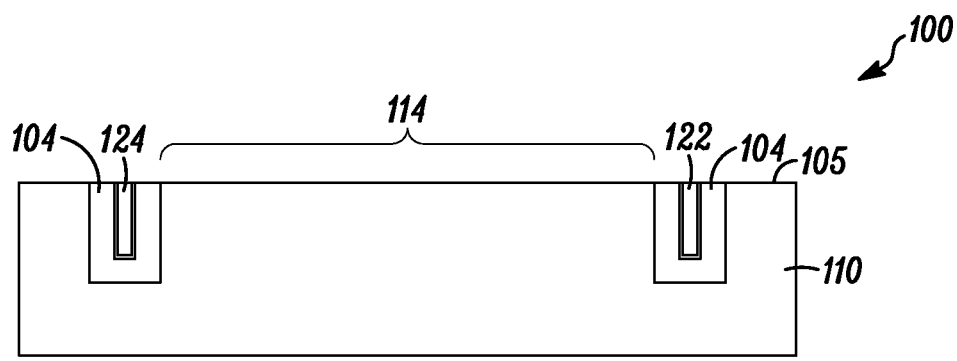
FIG. 2 is a cross-sectional view of the semiconductor structure of FIG. 1 taken along section line 2-2 of FIG. 1.

FIG. 2 shows a cross-sectional view of semiconductor structure 100 of FIG. 1 taken along section line 2-2 of FIG. 1. FIG. 2 illustrates dielectric structure 104, ground interconnect 124, digital power supply interconnect 122 and digital power circuit region 114. As will be discussed further below, at least a portion of dielectric structure 104 may be between electrically conductive material 122 and substrate 110. At least a portion of dielectric structure 104 may be between electrically conductive material 124 and substrate 110. In other embodiments, at least a portion of dielectric structure 104 may be between at least a portion of electrically conductive material 122 and 124 and at least a portion of substrate 110.

The semiconductor structure disclosed herein and shown in one example in FIGS. 1 and 2, provides for reduced interconnect resistance, increased frequency of operation and reduced coupling or cross-talk between active and passive devices and/or regions and other conductive elements for example interconnects and a conductive substrate.

The interconnect resistance may be determined by the relationship R (resistance)=$\rho L/A$ where $\rho$ is the resistivity of the material, L is the length of the interconnect and A is the cross-sectional area of the interconnect. It is clear that for a given material and interconnect length; increasing the cross-sectional area will result in a corresponding reduction in interconnect resistance. However, in conventional circuits increasing the width of the interconnect to reduce its resistance is undesirable because this consumes more area on the die, reduces the component density and increases the cost of the chip. Increasing the thickness of the interconnect increases the surface topography, leading to increased difficulty of subsequent processing steps, lower yield and higher costs.

Conventional interconnects are formed on the surface or near surface region of the semiconductor substrate. Die size constraints limit the cross-sectional dimensions of typical interconnects to the range of about 0.5 microns×0.5 microns to about 1.0 microns×4.0 microns, with cross-sectional areas in the range of about 0.25 microns$^2$ to about 4.0 microns$^2$.

Referring to FIG. 2, interconnects 122 and 124 utilize the vertical dimension below surface 105 of substrate 110 to form interconnects that may have a larger cross-sectional area than those used to date and thus may have a relatively lower resistance. Representative interconnects 122 and 124 may have a width in the range of about 0.5 microns to about 5 microns and a depth in the range of about 1.0 micron to about 30 microns. In one example interconnects 122 and 124 may have a width of about 3 microns and a depth of about 10 microns. In this example the cross-sectional area is about 30 microns$^2$, which is a factor of about 30/4 or about 7.5× larger than that of conventional interconnects and thus has a resistance which is about 7.5× less than that of conventional interconnects. This may greatly reduce the power loss in this interconnect, resulting in less undesired heat generation and higher efficiency.

High frequency operation is limited by capacitive coupling between conductive substrate 110 and other conductive elements such as active elements, passive elements and interconnects. Furthermore capacitive coupling between active and or passive devices, or between interconnects, or between one or more of each of these elements causes cross-talk, where a portion of the signal in one element is coupled to a second element, degrades performance.

Increasing the thickness of a dielectric material between elements may reduce capacitive coupling and cross-talk. Passive elements and interconnects are typically formed on an interlayer dielectric (ILD) layer to separate the conductive interconnect from underlying conductive elements. The typical thickness of an ILD is in the range of about 0.7 microns to about 1.0 microns. The spacing between conventional elements, which controls the extent of cross-talk, is typically in the range of about 0.5 microns to about 1 micron. Increasing the spacing to reduce parasitic capacitive coupling and cross-talk results in an undesirable increase in the die size and greatly increased chip cost. Increasing the thickness of the ILD layer greatly increases the processing complexity, decreases the yield and leads to increased chip costs.

Again, referring to FIG. 2, interconnects 122 and 124 may be partially or completely embedded in dielectric structure 104. Dielectric structure 104 underneath interconnects 122 and 124 may have a thickness in the range of about 0.5 microns to about 50 microns. Dielectric structure 104 adjacent to interconnects 122 and 124 may have a width in the range of about 1.0 micron to about 12 microns. In comparison to conventional interconnects, the spacing between other interconnects or between an interconnect and other conductive elements, for example other circuits or substrate 110 is greater by a factor in the range of about 3 to about 20. This greatly reduces the parasitic capacitive coupling to other conductive elements, resulting in higher frequency operation, improved isolation and reduced cross-talk.

Capacitive coupling between passive elements and the substrate or other conductive elements may also result in reduced performance. In one embodiment, passive elements formed in passive region 118 (FIG. 1) may be separated from the substrate by the thickness of dielectric structure 104. For example, passive components such as, for example, inductors, capacitors, or electrical interconnects, may be formed over embedded dielectric structure 104 and may have reduced parasitic capacitive coupling between these passive components and substrate 110 since embedded dielectric structure 104 has a relatively low dielectric constant or permittivity and since the embedded dielectric structure 104 increases the distance between the passive components and conductive substrate 110. In one example the thickness of dielectric structure 104 may be in the range of about 2.0 microns to about 30 microns In one example, passive region 118 may comprise one or more electrically conductive materials forming passive components, for example, aluminum, copper, gold, nickel, permalloy, or doped polycrystalline silicon formed over dielectric structure 104. In various examples, passive components may be an inductor, a capacitor, a resistor, or an electrical interconnect and may be coupled to one or more active devices formed in active regions 111, 112, 114 and/or 116.

Further, dielectric structure 104 may be used to form relatively high quality passive devices such as, for example, capacitors and inductors having a relatively high quality factor (0) since dielectric structure 104 may be used to isolate and separate the passive devices from conductive substrate 110. Active devices, such as transistors or diodes, may be formed in regions adjacent to, or abutting, the dielectric structure 104, and these active devices may be coupled to and employ passive components such as spiral inductors, interconnects, microstrip transmission lines and the like that are formed on a planar upper surface of dielectric structure 104. Separating the passive components from substrate 110 allows higher Q's to be realized for these passive components.

As will be discussed, the structures described in FIGS. 1 and 2 may be fabricated before or after fabrication of the active devices. In other words, some embodiments are capable of withstanding relatively high temperature operations required in active device fabrication. In some embodiments, multiple levels of interconnects may be fabricated within dielectric structure 104. In other embodiments, an air gap may be formed surrounding a portion of the electrically conductive interconnect, to further reduce parasitic capacitive coupling.

Referring back to FIG. 1, FIG. 1 shows active areas 111, 112, 114 and 116 completely surrounded by dielectric structure 104. In this case, dielectric structure 104 may also be used to provide electrical isolation in semiconductor structure 100. For example, dielectric structure 104 may provide electrical isolation between active regions 111, 112, 114 and 116. Although dielectric structure 104 in FIG. 1 is shown as surrounding all active areas, this is not a limitation of the claimed subject matter. In other embodiments, one or more regions of dielectric structure 104 may surround none, or one or more of the active or passive area regions and/or one or more regions of dielectric structure 104 may be formed adjacent to or abutting a portion of one or more active or passive regions. Although rectangular shaped active, passive and power supply regions and a rectangular shaped dielectric structure 104 are illustrated in FIG. 1, this is not a limitation of the claimed subject matter. In other embodiments, dielectric structure 104 and active regions, passive regions and power supply regions may have any arbitrary shape. Furthermore the example shown in FIG. 1 is not meant to be limiting in terms of the number and types of different regions and any number different regions may be used in other embodiments.

Referring to FIGS. 1 and 2, interconnects 120, 122, 124, 126, 130 and 132 are shown with rectangular cross-sections, however this is not a limitation of the claimed subject matter and interconnects 120, 122, 124, 126, 130 and 132 may have any arbitrary cross-sectional shape, for example, circular or square. Again referring to FIGS. 1 and 2, interconnects 120, 122, 124, 126, 130 and 132 are shown as straight lines, however this is not a limitation of the claimed subject matter and interconnects 120, 122, 124, 126, 130 and 132 may be formed in any arbitrary shape.

As stated above, dielectric structure 104 may be comprised mainly of one or more low dielectric constant materials, for example silicon dioxide. Silicon dioxide ($SiO_2$) has a dielectric constant of about 3.9. Accordingly, a solid or filled dielectric structure that includes no voids, such as dielectric structure 104, and includes silicon dioxide may have a dielectric constant of about 3.9. In some embodiments described herein, dielectric structure 104 may include voids occupying a portion of the total volume of dielectric structure 104. This may result in an effective dielectric constant reduction in proportion to the ratio of void space to dielectric material.

Figure 3:
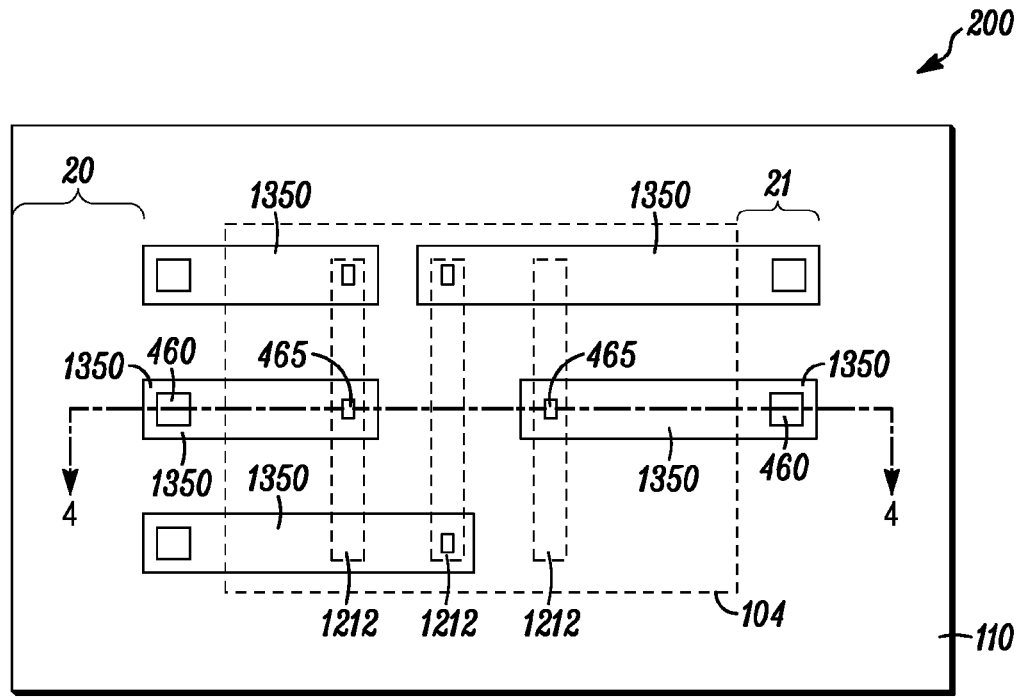
FIG. 3 is a plan view of another semiconductor structure in accordance with an embodiment.
Figure 4:
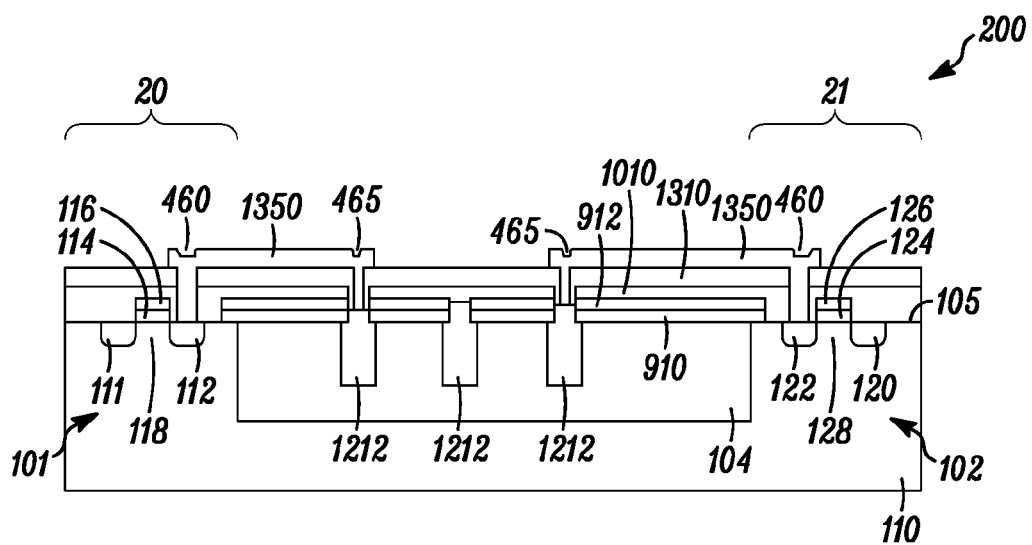
FIG. 4 is a cross-sectional view the semiconductor structure of FIG. 3 taken along section line 4-4 of FIG. 3.

FIG. 3 shows a plan view of semiconductor structure 200, in accordance with one or more embodiments. FIG. 4 shows a cross-sectional view of semiconductor structure 200 of FIG. 3 taken along section line 4-4 of FIG. 3. Turning first to FIG. 3, semiconductor structure 200 may comprise dielectric structure 104, active regions 20 and 21, conductive bus lines 1212, contacts 460 and 465, interconnects 1350 and substrate 110. Conductive bus lines 1212 may be referred to as bus lines, buried bus lines, interconnects or buried interconnects. In FIG. 3, dielectric structure 104 and conductive bus lines 1212 are referenced with dashed lines, indicating that they are below the visible surface. As seen in FIGS. 3 and 4 contacts 460 couple drain region 112 of FET 101 to interconnect 1350 and drain 122 of FET 102 to interconnect 1350 and contacts 465 couple interconnects 1350 to bus lines 1212.

Referring now to FIG. 4, a field effect transistor ("FET") 101 may be formed in active region 20 and a FET 102 may be formed in active region 21. FET 101 may be a MOSFET and may include a source region 111 in a portion of substrate 110, a drain region 112 in a portion of substrate 110, a gate oxide 114 over a portion of substrate 110, a gate 116 over gate oxide 114, and a channel region 118 formed in a portion of substrate 110 under gate oxide 114 and between doped regions 111 and 112. FET 102 may be a MOSFET and may include a source region 120 in a portion of substrate 110, a drain region 122 in a portion of substrate 110, a gate oxide 124 over a portion of substrate 110, a gate 126 over gate oxide 124, and a channel region 128 formed in a portion of substrate 110 under gate oxide 124 and between doped regions 120 and 122. Although one FET is shown in each active region, this is not a limitation of the claimed subject matter and each active region may contain more than one transistor, diode or other active devices.

Although the width of interconnects 1350 are shown as all the same, this is not a limitation of the claimed subject matter. In other examples, interconnects 1350 may be of different widths and depths. Similarly although bus lines 1212 are shown as all having the same widths and depths, this is not a limitation of the claimed subject matter and bus lines 1212 may have different widths and depths.

Dielectric structure 104 in FIG. 3 is shown as separating active regions 20 and 21. In other embodiments dielectric structure 104 may partially or fully encircle one or more active regions.

Although only a single active device is shown as being formed in each active region 20 and 21 of substrate 110, the methods and apparatuses described herein are not limited in this regard. In some embodiments, a plurality of active devices may be formed in active regions 20 and 21 of substrate 110.

Substrate 110 may serve as part of a drain region of a vertical transistor (not shown) formed in active region 21. In this example, a source contact or electrode (not shown) may be formed on or adjacent to an upper surface of substrate 110 and a drain electrode (not shown) may be formed on or adjacent to a lower surface of substrate 110. During operation, the electrical current flow from the source electrode to the drain electrode in the vertical transistor may be substantially perpendicular to the upper and lower surfaces of semiconductor substrate 110. In other words, current flows essentially vertically through the vertical transistor from the electrode located adjacent a top surface of semiconductor structure 200 to a drain electrode located adjacent to the opposite bottom surface of semiconductor structure 200. An example of a vertical transistor is described in U.S. patent application Ser. No. 10/557,135, entitled "POWER SEMICONDUCTOR DEVICE AND METHOD THEREFOR," filed Nov. 17, 2005, which claims priority to Patent Cooperation Treaty (PCT) International Application Number PCT/US2005/000205 entitled "POWER SEMICONDUCTOR DEVICE AND METHOD THEREFOR," having an International Filing Date of Jan. 6, 2005 and an International Publication Date of Jul. 28, 2005, the contents of both of these patent applications are incorporated herein by reference in their entirety.

Figure 5:
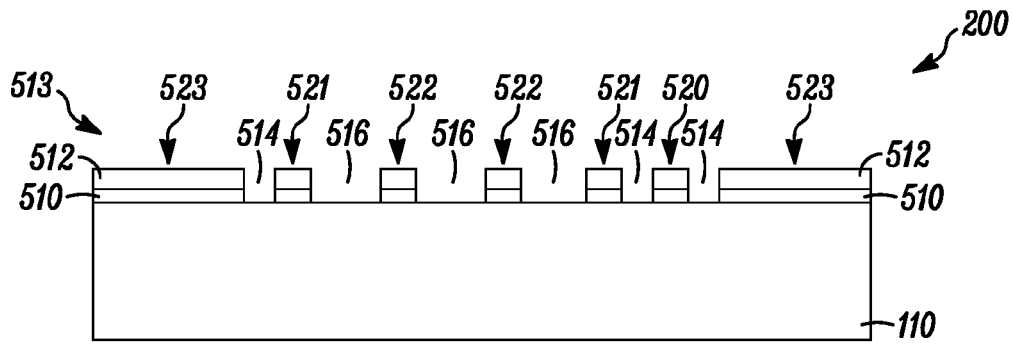
FIG. 5 is a cross-sectional view of the semiconductor structure of FIG. 4 an early stage of fabrication.

FIGS. 5 to 13 illustrate at least one embodiment for making semiconductor structure 200 of FIGS. 3 and 4. In this example the interconnect structure is fabricated prior to fabrication of active devices. Turning to FIG. 5, FIG. 5 shows a cross-sectional view of semiconductor structure 200 of FIG. 4 at an early stage of fabrication. At the stage illustrated in FIG. 5, dielectric layer 510 is formed over substrate 110 and dielectric layer 512 is formed over dielectric layer 510. In one example dielectric layer 510 may be silicon dioxide and dielectric layer 512 may be silicon nitride. Dielectric layer 510 may comprise, for example, silicon dioxide and have a thickness ranging from about 50 Angstroms (Å) to about 5,000 Å. Dielectric layer 510 may be formed using deposition techniques or thermal growth techniques such as, for example, thermal oxidation of silicon. Dielectric layer 512 may comprise, for example, silicon nitride ($Si_3N_4$) and have a thickness ranging from about 100 Å to about 2,000 Å. Dielectric layer 512 may be formed using deposition techniques, for example, low pressure chemical vapor deposition (LPVCD) of silicon nitride.

In an alternate embodiment, only dielectric material 510 may be formed (not shown). Dielectric layer 510 may comprise, for example, silicon dioxide and have a thickness ranging from about 1000 Å to about 20,000 Å.

After dielectric layer 512 is formed, dielectric layer 512 and dielectric layer 510 may be patterned using photolithography and etching processes to form openings 514 and 516 and masked or covered areas 520, 521, 522 and 523. Masked areas 520, 521, 522, and 523 include portions of layers 510 and 512. Masked area 520 is between two openings 514, masked area 521 is between one opening 514 and one opening 516, masked area 522 is between two openings 516 and masked area 523 defines the periphery of what will become dielectric structure 104 (FIG. 4). Masked areas 520, 521, 522, and 523 together form a mask structure 513 and openings 514 and 516 expose portions of substrate 110. Photolithography processes or operations involve the use of masks and may sometimes be referred to as masking operations or acts. The photolithography and etching may include forming a layer of a radiation-sensitive material, such as, for example, photoresist (not shown), over dielectric layer 512, then exposing the photoresist using, for example, ultraviolet (UV) radiation and developing the resist to form a mask, and then etching portions of dielectric layers 512 and 510 to form openings 514 and 516.

Openings 514 and 516 may be formed using at least one etching operation. In some embodiments, two or more etching operations may be used to form openings 514 and 516. In some embodiments, silicon nitride layer 512 may be etched using a wet chemical etch or a dry etch process such as, for example, a reactive ion etch (RIE). Silicon dioxide layer 510 may be etched using a wet chemical etch or a dry etch process such as, for example, a reactive ion etch (RIE).

The width or diameter of openings 514 and 516 and masked areas 510, 521 and 522 determine the width and separation of interconnects 1212 (FIG. 4). In one example, openings 514 and masked areas 520, 521 and 522 each have a width or diameter equal to about ⅓ of the desired separation between interconnects 1212 (FIG. 4) and the width or diameter of openings 516 have a width equal to about the sum of the desired width of interconnect 1212 and two times the width or diameter of opening 514. Although the width or diameter of interconnects 1212 in FIG. 4 may be all the same, this is not a limitation of the claimed subject matter. In other embodiments, semiconductor structure may contain interconnects with different widths or diameters.

In one example openings 514 and masked areas 520, 521 and 522 may each be in the range of about 1.0 microns to about 3 microns and openings 516 may be in the range of about 3.0 microns to about 10 microns. Although the spacing between any two openings (either 514 and/or 516) shown in FIG. 5 may be substantially the same, this is not a limitation of the claimed subject matter. The spacing between openings 514 and the size of openings 514 do not have to be the same, or substantially the same. Further, although openings 514 and 516 may be shown as rectangular, this is not a limitation of the claimed subject matter. Openings 514 and 516 may have any shape and may be formed in a periodic or non-periodic arrangement. The width of mask area 523 is dependent on the circuit layout. In one example the width of masked area 523 may be in the range of about 3.0 microns to about 1000 microns. In another example the width of masked area 523 may be in the range of about 5.0 microns to about 10 microns.

Dielectric layer 512 or a combination of dielectric layer 510 and dielectric layer 512 may serve as a hard mask, and may be referred to as a masking layer. Since the photoresist (not shown) over dielectric 512 may optionally be left in place during the next etch step, it may also be etched as part of the etch step used to etch portions of dielectric layer 512, portions of dielectric layer 510 and portions of substrate 110. Dielectric layer 512 or a combination of dielectric layer 510 and dielectric layer 512 may be used as a hard mask to prevent the undesired etching of the upper surface of substrate 110 during the formation of openings 514 and 516 and subsequent removal of a portion of substrate 110 exposed by openings 514 and 516. In alternate embodiments, the photoresist layer may be made relatively thick such that it is not completely eroded during the etching process. Accordingly the thickness of dielectric material 510 or the combination of dielectric materials 510 and 512 must be large enough so that it is not completely removed during the next etching step.

Figure 6:
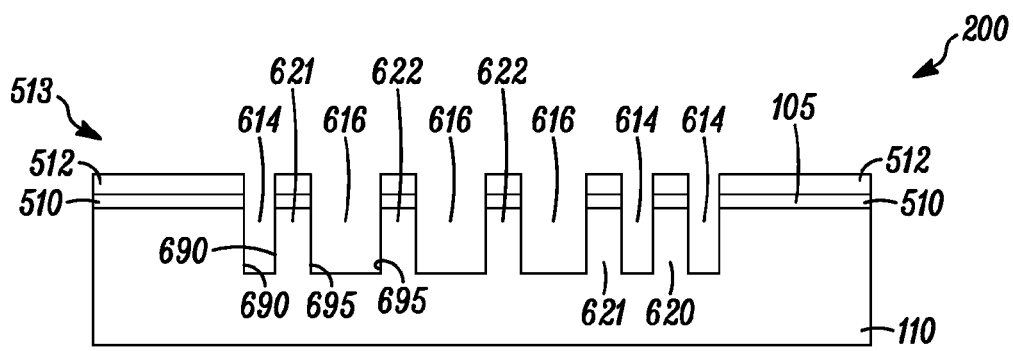
FIG. 6 is a cross-sectional view of the semiconductor structure of FIG. 5 at a later stage of fabrication.

Turning now to FIG. 6, FIG. 6 shows semiconductor structure 200 of FIG. 5 at a later stage of manufacture. After formation of openings 514 and 516 (FIG. 5), cavities 614 and 616 may be formed in substrate 110 using mask 513 and a wet chemical or dry etch, for example reactive ion etching (RIE) to remove portions of substrate 110. In one example cavities 614 and 616 may be formed using an anisotropic RIE etch. Cavities 614 and 616 may be referred to as voids, open voids, cavities, open cavities, pores, openings or trenches. In one embodiment, cavities 614 and 616 may have an aspect ratio (the ratio of the depth to width) of at least two (2). In another example, the aspect ratio may be at least ten (10). For a given width, a larger aspect ratio will result in a larger interconnect cross-sectional area, and thus reduced interconnect resistance. The formation of cavities 614 and 616 may form a vertical structure 620 between two cavities 614, a vertical structure 621 between cavity 614 and 616 and a vertical structure 622 between two cavities 616. Vertical structures 620, 621 and 622 may be comprised of a portion of substrate 110.

While the sidewalls 690 and 695 in FIG. 6 are shown as perpendicular to, or substantially perpendicular to surface 105 of substrate 110, other sidewall profiles may also be utilized and the specific sidewall profile is not a limitation of the claimed subject matter. In one embodiment, one etching step may be used to form cavities 614 and 616, although the methods and apparatuses described herein are not limited in this regard.

Figure 7:
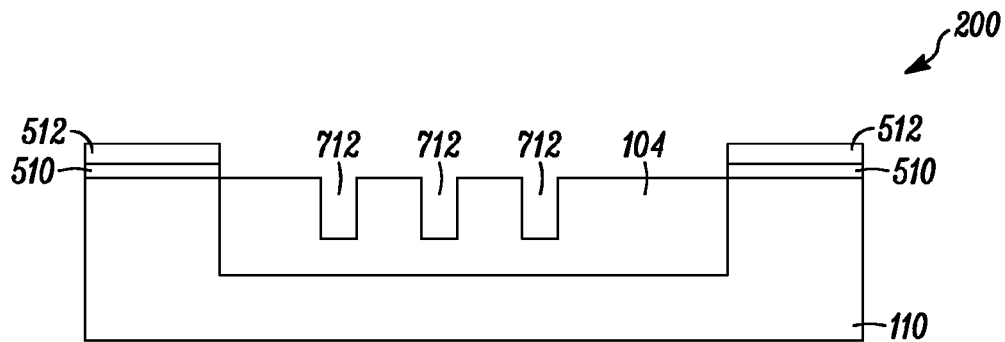
FIG. 7 is a cross-sectional view of the semiconductor structure of FIG. 6 at a later stage of fabrication.

FIG. 7 shows semiconductor structure 200 of FIG. 6 at a later stage of manufacture. Referring now to FIG. 7 dielectric material 104 is formed on the exposed surfaces of cavities 614 and 616 (FIG. 6). In one example, dielectric material 104 is silicon dioxide and is formed by thermal oxidation. In this example thermal oxidation may be performed to convert a portion of, all of, or substantially all of, the exposed silicon of cavities 614 and 616 to silicon dioxide to form silicon dioxide material 104.

As discussed above, the width of vertical structures 620, 621 and 622 may be in the range of about 3.0 microns or less in some embodiments. In the example where vertical structures 620, 621 and 622 comprise silicon, the thicker the width of silicon structures 620, 621 and 622, the longer it will take to fully oxidize silicon structures 620, 621 and 622. FIG. 7 shows an example where all of the silicon in silicon structures 620, 621 and 622 has been completely converted to silicon dioxide. However, this is not a limitation of the claimed subject matter and in other embodiments, only a portion of the silicon in silicon structures 620, 621 and/or 622 may be converted to silicon dioxide. In one example cavities 712 may have a width in the range of about 1.0 micron to about 3.0 microns.

In this example the silicon underneath masked areas 520 (FIG. 5), 521 (FIG. 5) and 522 (FIG. 5) may be completely oxidized and the dimensions of masked areas 520 (FIG. 5), 521 (FIG. 5) and 522 (FIG. 5) and openings 514 (FIG. 5) may be substantially equal such that cavities 614 (FIG. 6) are eliminated through the oxidation process, leaving only oxide 104 and cavities 712. Cavities 614 may be eliminated because of the 2.2× volume expansion that silicon undergoes when it is oxidized. This volume expansion may also result in a reduction in the width of cavity 712 compared to the width of cavity 616 (FIG. 6) before oxidation. In this embodiment, dielectric material 104 forms the dielectric structure 104 discussed above with reference to FIG. 4 and accordingly dielectric material 104 may be referred to as dielectric structure 104 in subsequent figures. As discussed above, in other embodiments, dielectric structure 104 may include voids and/or more than one dielectric material.

Although the widths of cavities 712 in FIG. 7 are all the same, this is not a limitation of the claimed subject matter. In other embodiments, cavities 712 may have different widths. The result of this oxidation process is the formation of cavities 712 in dielectric structure 104. Cavities 712 may eventually be filled or partially filled with an electrically conductive material to form interconnect 1212 (FIG. 4).

In one example the depth of cavities 712 may be in the range of about 2 microns to about 40 microns. In another example the depth of cavities 712 may be in the range of about 4 microns to about 20 microns. In one example spacing between cavities 712 may be in the range of about 0.2 microns to about 2 microns.

Although cavities 712 are shown as rectangular, this is not a limitation of the claimed subject matter and cavities 712 may have any shape and may be formed in a periodic or non-periodic arrangement. In the example shown in FIG. 7 all silicon 110 underneath masked areas 520 (FIG. 5), 521 (FIG. 5) and 522 (FIG. 5) may be completely oxidized, leaving only oxide and no silicon. In other embodiments, silicon 110 underneath masked areas 520 (FIG. 5), 521 (FIG. 5) and 522 (FIG. 5) may only be partially oxidized, leaving some silicon material embedded in oxide 104.

Since the dielectric constant of silicon is greater than the dielectric constant of silicon dioxide, reducing the amount of silicon remaining in silicon structures 620 (FIG. 6), 621 (FIG. 6) and/or 622 (FIG. 6) may reduce the effective dielectric constant of dielectric structure 104.

Figure 8:
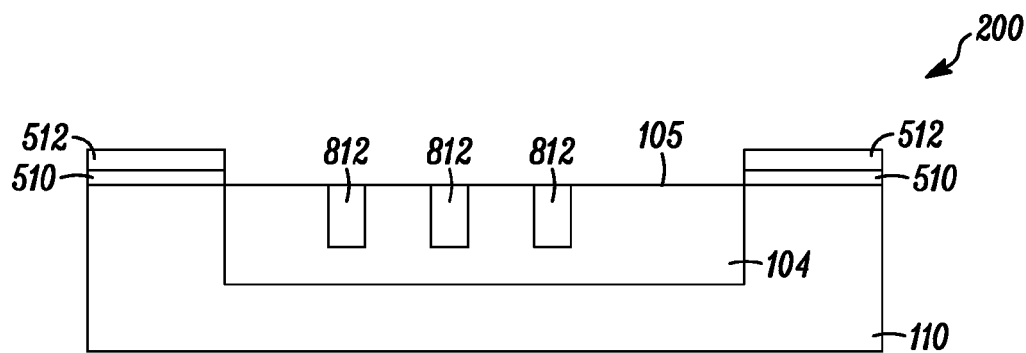
FIG. 8 is a cross-sectional view of the semiconductor structure of FIG. 7 at a later stage of fabrication.

FIG. 8 shows semiconductor structure 200 of FIG. 7 at a later stage of manufacture. As discussed above, in this example the interconnect structure may be formed after device fabrication. Turning now to FIG. 8, cavities 712 may be filled with a sacrificial material 812. In one example sacrificial material 812 may comprise polysilicon and may be formed using low pressure chemical vapor deposition (LPCVD). After formation of sacrificial material 812, excess sacrificial material 812 may be removed, leaving sacrificial material 812 only in cavities 712 (FIG. 7) with a surface coplanar or substantially coplanar with surface 105 of substrate 110. Excess sacrificial material 812 may be removed using wet chemical etching, dry (RIE) etching, chemical mechanical polishing (CMP) or a combination of these processes. Other suitable materials for sacrificial material 812 include silicon nitride, phosphorus silicate glass (PSG), boron phosphorus silicate glass (BPSG), an oxide formed using tetraethylorthosilicate (TEOS), or the like.

Figure 9:
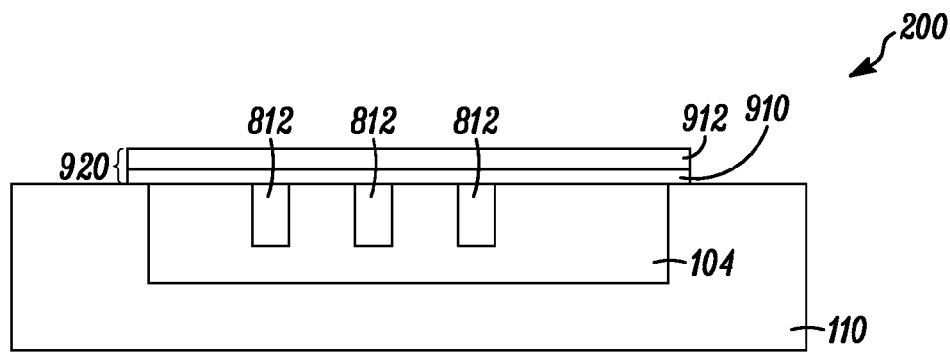
FIG. 9 is a cross-sectional view of the semiconductor structure of FIG. 8 at a later stage of fabrication.

Turning now to FIG. 9, FIG. 9 shows semiconductor structure 200 of FIG. 8 at a later stage of manufacture. At this stage of the process, dielectric layers 510 and 512 may be optionally removed. Referring to the example shown in FIG. 9, dielectric layers 510 and 512 have been removed. Dielectric layers 510 and 512 may be removed as part of the process of removing excess sacrificial material 812 or in one or more separate steps.

After optional removal of dielectric layers 510 and 512, protection structure 920 may be formed over sacrificial material 812 and dielectric structure 104 for protection during subsequent processing. Protection structure 920 may comprise one or more layers. In the embodiment shown in FIG. 9 protection structure 920 is comprised of layers 910 and 912.

At the stage illustrated in FIG. 9, dielectric layer 910 may be formed over sacrificial material 812, dielectric structure 104 and a portion of substrate 110, and dielectric layer 912 may be formed over dielectric layer 910. In one example dielectric layer 910 may be silicon dioxide and dielectric layer 912 may be silicon nitride. Dielectric layer 910 may comprise, for example, silicon dioxide and have a thickness ranging from about 50 Å to about 5,000 Å. Dielectric layer 910 may be formed using deposition techniques, such as for example low pressure chemical vapor deposition (LPVCD). Dielectric layer 912 may comprise, for example, silicon nitride ($Si_3N_4$) and have a thickness ranging from about 100 Å to about 2,000 Å. Dielectric layer 912 may be formed using deposition techniques, for example, low pressure chemical vapor deposition (LPVCD) of silicon nitride.

Figure 10:
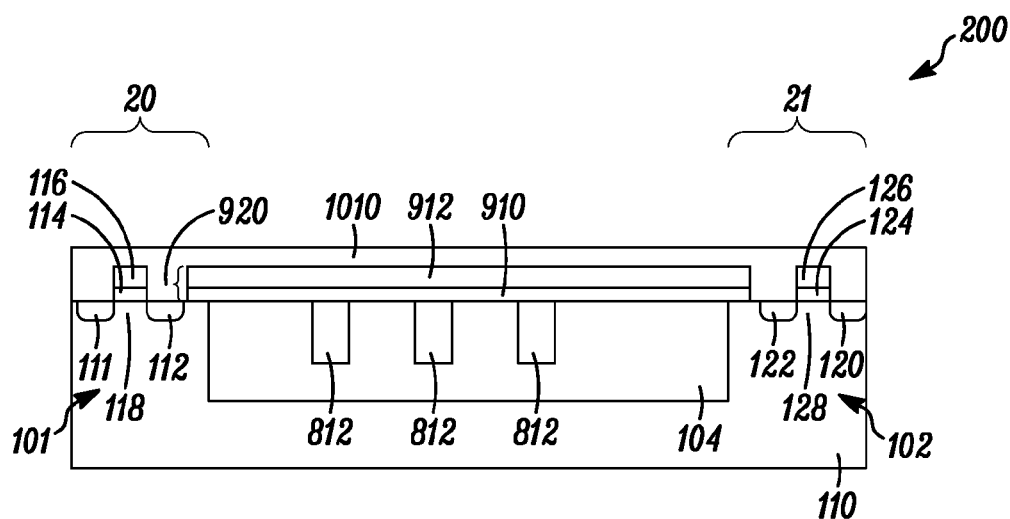
FIG. 10 is a cross-sectional view of the semiconductor structure of FIG. 9 at a later stage of fabrication.

After formation of protection structure 920, active devices may be formed in portions of substrate 110 using conventional techniques. FIG. 10 shows semiconductor structure 200 of FIG. 9 at a later stage of manufacture. As seen in FIG. 10, FET 101 may be formed in active region 20 and FET 102 may be formed in active region 21. After formation of active devices, active device protection layer 1010 may be formed over active regions 20 and 21, and protection structure 920. Active protection layer 1010 may comprise dielectric materials such as silicon dioxide, silicon nitride, phosphorus silicate glass (PSG), boron phosphorus silicate glass (BPSG), an oxide formed using tetraethylorthosilicate (TEOS), or the like. In one example active device protection layer 1010 may comprise silicon dioxide formed by plasma enhanced CVD (PECVD) deposition. In one example the thickness of active device protection layer 1010 may range from about 0.2 microns to about 5 microns. While active device protection layer 1010 shown in FIG. 10 is comprised of one layer, this is not a limitation of the claimed subject matter and active device protection layer 1010 may be comprised of more than one layer.

Figure 11:
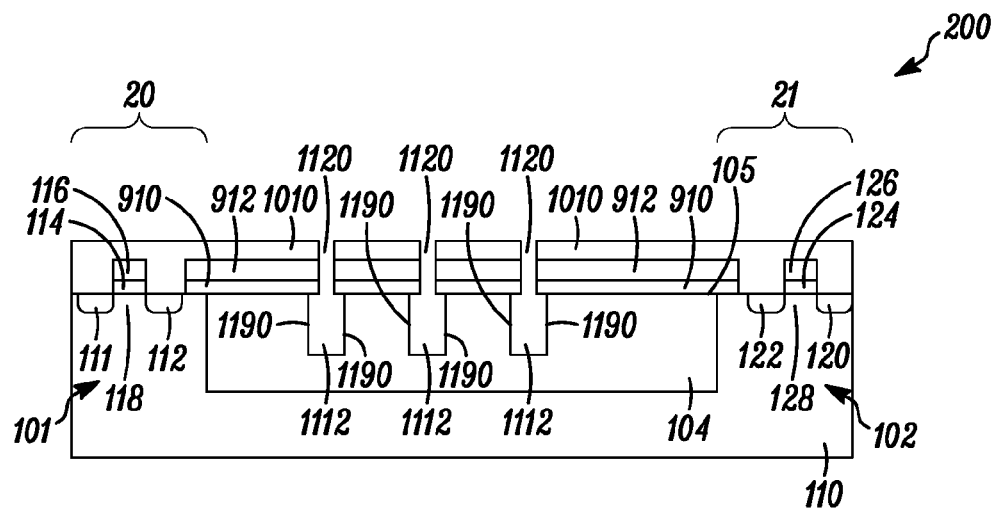
FIG. 11 is a cross-sectional view of the semiconductor structure of FIG. 10 at a later stage of fabrication.

FIG. 11 shows semiconductor structure 200 of FIG. 10 at a later stage of manufacture. After formation of active protection layer 1010, active protection layer 1010, dielectric layer 912 and dielectric layer 910 may be patterned using photolithography and etching processes to form openings 1120 to expose sacrificial material 812 (FIG. 10). Openings 1120 may be formed using at least one etching operation. In some embodiments, two etching or more etching operations may be used to form openings 1120. In some embodiments, active protection layer 1010 may be etched using a wet chemical etch or a dry etch process such as, for example, a reactive ion etch (RIE). Silicon nitride layer 912 may be etched using a wet chemical etch or a dry etch process such as, for example, a reactive ion etch (RIE). Silicon dioxide layer 910 may be etched using a wet chemical etch or a dry etch process such as, for example, a reactive ion etch (RIE).

The width of openings 1120 may be in the range of about 0.5 microns to about 3 microns. In one example openings 1120 may be in the range of about 1.0 microns to about 2 microns. Although the width of openings 1120 shown in FIG. 11 is substantially the same, this is not a limitation of the claimed subject matter. The width of openings 1120 do not have to be the same, or substantially the same. Further, although openings 1120 are shown as rectangular, this is not a limitation of the claimed subject matter. Openings 1120 may have any shape and may be formed in a periodic or non-periodic arrangement.

After formation of openings 1120, sacrificial material 812 (FIG. 10) may be removed through openings 1120. In one embodiment, one etching step may be used to remove sacrificial material 812 (FIG. 10), although the methods and apparatuses described herein are not limited in this regard. In another embodiment, sacrificial material 812 (FIG. 10) may be removed in the same etching step as used for removal of a portion of dielectric layer 910 to form openings 1120. In one example sacrificial material 812 (FIG. 10) may be removed using a vapor phase etch, a wet chemical etch, or a dry etch, for example reactive ion etching (RIE). Removal of sacrificial material 812 (FIG. 10) leaves cavities 1112 with sidewalls 1190, as shown in FIG. 11. While sidewalls 1190 are shown as perpendicular or substantially perpendicular to surface 105 of substrate 110 this is not a limitation of the claimed subject matter and sidewalls 1190 may make any arbitrary angle with surface 105.

Figure 12:
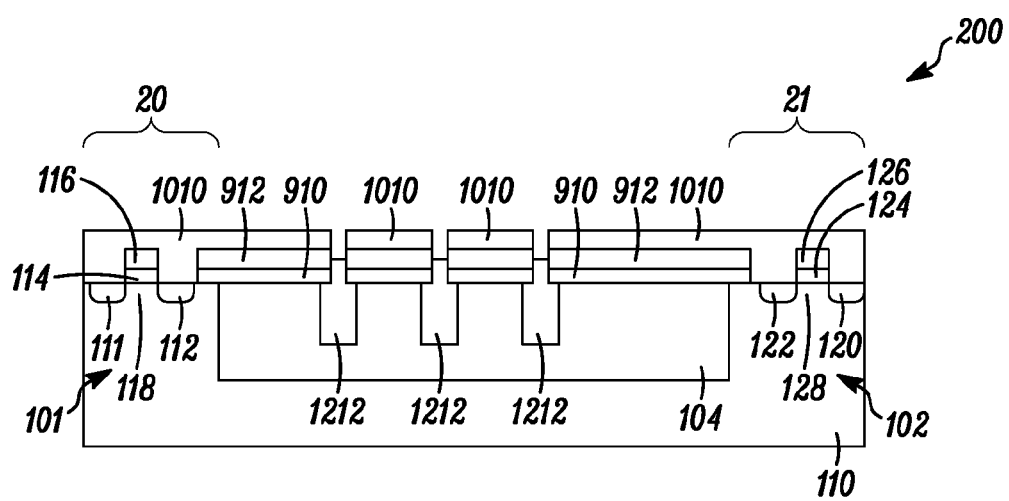
FIG. 12 is a cross-sectional view of the semiconductor structure of FIG. 11 at a later stage of fabrication.

FIG. 12 shows semiconductor structure 200 of FIG. 11 at a later stage of manufacture. After removal of sacrificial material 812 (FIG. 10) and resulting formation of cavities 1112 (FIG. 11), cavities 1112 (FIG. 11) may be filled with an electrically conductive material to form bus lines 1212. Bus lines 1212 may be formed by first filling cavities 1112 (FIG. 11) with a conductive material followed by optional removal of excess conductive material. In one example the amount of conductive material that may need to be deposited is that sufficient to partially or fully fill cavities 1112 (FIG. 11). The top surface of bus line 1212 may range from below surface 105 of substrate 110 to coplanar or substantially coplanar with the surface of layer 1010. In the example shown in FIG. 12, the top surface of bus line 1212 may be above surface 105 of substrate 110 and below the surface of layer 1010.

Bus line 1212 may be formed using deposition processes such as evaporation, sputtering, or chemical vapor deposition (CVD). Bus line 1212 may also be formed using plating or electroplating. In one example bus line 1212 may comprise more than one material deposited sequentially; for example bus line 1212 may comprise three layers of titanium/titanium nitride/tungsten. The Ti layer may act as an adhesion layer and may be in the range of about 100 Å to about 500 Å thick. The TIN layer may act as a barrier layer and may be in the range of about 200 Å to about 1000 Å thick. The final tungsten layer may then be deposited to partially or completely fill or overfill cavities 1112 (FIG. 11). The materials and dimensions given here are for one or more embodiments and are not a limitation of the claimed subject matter. Other dimensions may be used.

Figure 13:
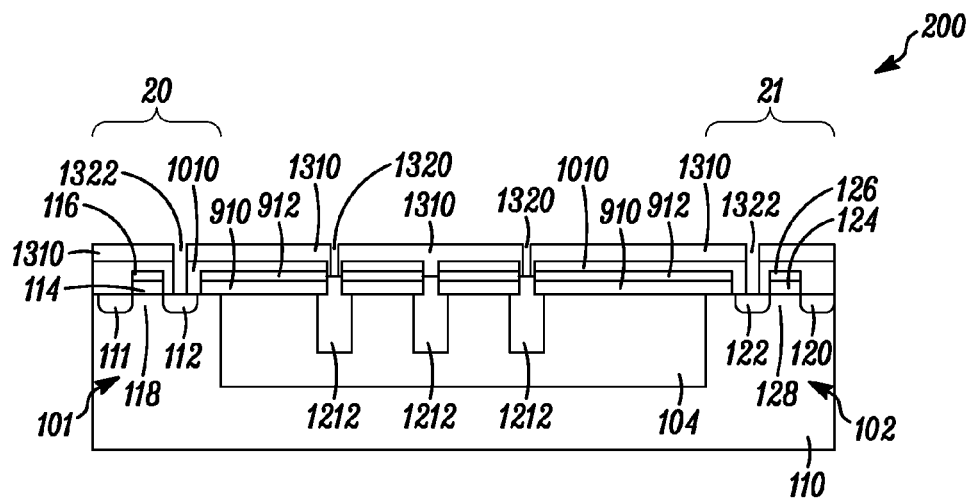
FIG. 13 is a cross-sectional view of the semiconductor structure of FIG. 12 at a later stage of fabrication.

FIG. 13 shows semiconductor structure 200 of FIG. 12 at a later stage of manufacture. After formation of bus line 1212, dielectric layer 1310 may be formed and patterned to form openings 1320 to expose one or more bus lines 1212 and to form openings 1322 to expose drain 112 of FET 101 and drain 122 of FET 102. Dielectric layer 1310 may comprise dielectric materials such as silicon dioxide, silicon nitride, phosphorus silicate glass (PSG), boron phosphorus silicate glass (BPSG), an oxide formed using tetraethylorthosilicate (TEOS), or the like. In one example dielectric layer 1310 may comprise silicon dioxide formed by PECVD deposition. In one example the thickness of dielectric layer 1310 may range from about 0.2 microns to about 5 microns. While dielectric layer 1310 shown in FIG. 13 is comprised of one layer, this is not a limitation of the claimed subject matter and dielectric layer 1310 may be comprised of more than one layer.

After formation of dielectric layer 1310, dielectric layer 1310, dielectric layer 1010, dielectric layer 912 and dielectric layer 910 may be patterned using photolithography and etching processes to form openings 1320 to expose bus line 1212 and openings 1322 to expose drain 112 of FET 101 and drain 122 of FET 102. Openings 1320 and 1322 may be formed using at least one etching operation. In some embodiments, two etching or more etching operations may be used to form openings 1320 and 1322. Dielectric layer 1310, dielectric layer 1010, dielectric layer 912 and dielectric layer 910 may be etched using a wet chemical etch or a dry etch process such as, for example, a reactive ion etch (RIE).

The width of openings 1320 and 1322 may be in the range of about 0.25 microns to about 3 microns. In one example openings 1320 and 1322 may be in the range of about 0.4 microns to about 1.5 microns. Although the width of openings 1320 and 1322 shown in FIG. 13 is substantially the same, this is not a limitation of the claimed subject matter. The width of openings 1320 and 1322 do not have to be the same, or substantially the same. Further, although openings 1320 and 1322 are shown as rectangular, this is not a limitation of the claimed subject matter. Openings 1320 and 1322 may have any shape and may be formed in a periodic or non-periodic arrangement. In another embodiment, dielectric layer 1310 may be omitted.

Turning back to FIG. 4, FIG. 4 shows semiconductor structure 200 of FIG. 13 at a later stage of manufacture. After formation of openings 1320 to expose bus lines 1212 and openings 1322 to expose drain 112 of FET 101 and drain 122 of FET 102, interconnects 1350 may be formed using deposition processes such as evaporation, sputtering, or chemical vapor deposition (CVD). Interconnects 1350 may also be formed using plating or electroplating. In one example interconnect 1350 may comprise AuSiCu where the percentage of Si may range from about 0.4% to about 1.5% and the percentage of Cu may range from about 0.4% to about 1.5%. In another example interconnects 1350 may comprise more than one material deposited sequentially; for example interconnects 1350 may comprise three layers of titanium/titanium nitride/aluminum+silicon+copper (Ti/TiN/AlSiCu). The Ti layer may act as an adhesion layer and may be in the range of about 10 Å to about 500 Å thick. The TiN layer may act as a barrier layer and may be in the range of about 200 Å to about 1000 Å thick. The Al/Si/Cu layer may be in the range of about 0.25 micron to about 4 microns thick. The materials and dimensions given here are for one or more embodiments and are not a limitation of the claimed subject matter. Other materials, for example aluminum+silicon (AlSi), titanium+tungsten (TiW) and titanium+tungsten+copper (TiWCu), as well as other dimensions may be used.

After deposition of the interconnect metal it may be patterned using photolithography and etching processes to form interconnect 1350. Interconnects 1350 may be formed using at least one etching operation. In some embodiments, two etching or more etching operations may be used to form interconnects 1350. For example interconnect 1350 may be etched using a wet chemical etch or a dry etch process such as, for example, a reactive ion etch (RIE).

Figure 14:
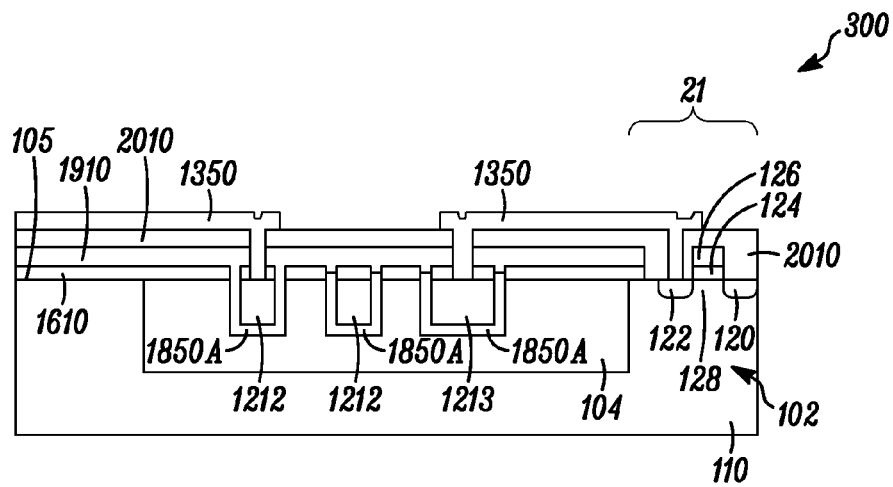
FIG. 14 is a cross-sectional view of another semiconductor structure; in accordance with an embodiment.

In the example process flow described above, the metallization for the buried bus lines is fabricated after the fabrication of the active devices. In another embodiment shown in FIG. 14, the metallization for the buried bus lines may be fabricated before the fabrication of the active devices. Turning to FIG. 14, FIG. 14 shows semiconductor structure 300 which is comprised of dielectric structure 104, conductive bus lines 1212 and 1213, interconnects 1350, active region 21 and substrate 110. Conductive bus lines 1212 and 1213 may be separated from dielectric structure 104 by sealed gaps 1850A. Conductive bus lines 1212 and 1213 may be referred to as bus lines, buried bus lines, interconnects or buried interconnects. Although bus lines 1212 and 1213 are shown as all having the same thicknesses, this is not a limitation of the claimed subject matter, and bus lines 1212 and 1213 may have different thicknesses. In the example shown in FIG. 14, bus lines 1212 and 1213 have different widths, in contrast to the example shown in FIG. 4, where all the bus lines have the same width. While sealed gaps 1850A are shown as having the same widths, this is not a limitation of the claimed subject matter and sealed gaps 850 Å may have different widths.

Referring now to FIG. 14, field effect transistor (FET) 102 may be formed in active region 21. FET 102 may be a MOSFET and may include a source region 120 in a portion of substrate 110, a drain region 122 in a portion of substrate 110, a gate oxide 124 over a portion of substrate 110, a gate 126 over gate oxide 124, and a channel region 128 formed in a portion of substrate 110 under gate oxide 124 and between doped regions 120 and 122. Although one active region and one FET in the active region is shown, this is not a limitation of the claimed subject matter and more than one active region may be present and each active region may contain more than one transistor, diode or other active devices.

Substrate 110 may serve as part of a drain region of a vertical transistor (not shown) formed in active region 21. In this example, a source contact or electrode (not shown) may be formed on or adjacent to an upper surface of substrate 110 and a drain electrode (not shown) may be formed on or adjacent to a lower surface of substrate 110. During operation, the electrical current flow from the source electrode to the drain electrode in the vertical transistor may be substantially perpendicular to the upper and lower surfaces of semiconductor substrate 110. In other words, current flows essentially vertically through the vertical transistor from the electrode located adjacent a top surface of semiconductor structure 300 to a drain electrode located adjacent to the opposite bottom surface of semiconductor structure 300. An example of a vertical transistor is described in U.S. patent application Ser. No. 10/557,135, entitled "POWER SEMICONDUCTOR DEVICE AND METHOD THEREFOR," filed Nov. 17, 2005, which claims priority to Patent Cooperation Treaty (PCT) International Application Number PCT/US2005/000205 entitled "POWER SEMICONDUCTOR DEVICE AND METHOD THEREFOR," having an International Filing Date of Jan. 6, 2005 and an International Publication Date of Jul. 28, 2005, the contents of both of these patent applications are incorporated herein by reference in their entirety.

Figure 15:
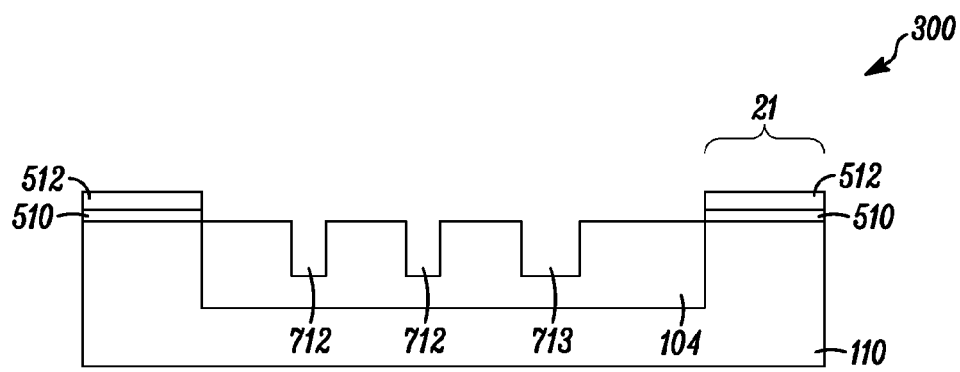
FIG. 15 is a cross-sectional view of the semiconductor structure of FIG. 14 an early stage of fabrication.

FIGS. 15 to 20 illustrate another embodiment for making semiconductor structure 300 of FIG. 14. In this example the interconnect structure is fabricated after fabrication of active devices. FIG. 15 shows semiconductor structure 300 of FIG. 14 at an early stage of manufacture. The process to fabricate the structure at the stage shown in FIG. 15 is the same as the process described previously in reference to FIGS. 5-7 of the previous example with the exception that all of the cavities 712 (FIG. 7) may not have the same width. Turning to FIG. 15, cavities 712 may have the same width and a second cavity 713 may have a different width. In this example second cavity 713 may have a width relatively larger than that of cavity 712. The example shown in FIG. 15 is not meant to be limiting and there may be any number of cavities each of which may have any width. The width may be in part determined by the required resistance of the bus line. In one example cavities 712 may have a width in the range of about 1.0 micron to about 3.0 microns and cavities 713 may have a width in the range of about 2.0 microns to about 10.0 microns.

Figure 16:
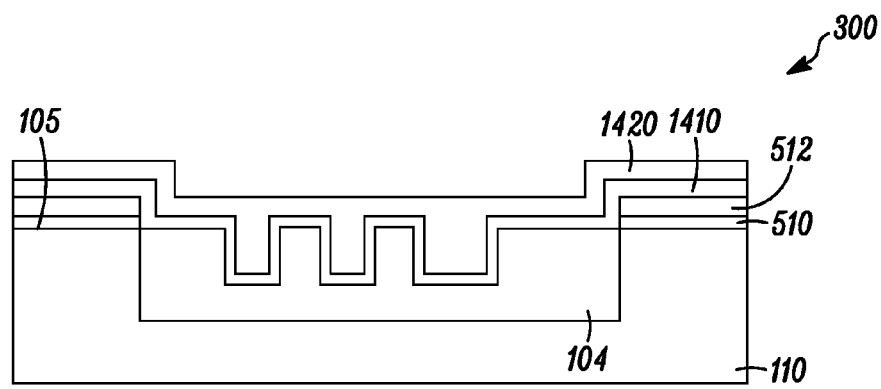
FIG. 16 is a cross-sectional view of the semiconductor structure of FIG. 15 at a later stage of fabrication.

FIG. 16 shows semiconductor structure 300 of FIG. 15 at a later stage of manufacture. After formation of cavities 712 (FIG. 15) and 713 (FIG. 15), sacrificial layer 1410 may be formed over dielectric layer 512 and dielectric structure 104 including the interior surfaces of cavities 712 (FIG. 15) and 713 (FIG. 15). Sacrificial layer 1410 may be polysilicon, a dielectric, or any other material that may be subsequently removed, as will be described below. In one example sacrificial layer 1410 may be able to be selectively etched, without etching dielectric structure 104 or bus lines 1212 (FIG. 14) or bus lines 1213 (FIG. 14). In one example, sacrificial layer 1410 may be polysilicon deposited by low pressure chemical vapor deposition (LPCVD) and have a thickness in the range of about 0.1 microns to about 3.0 microns. The thickness of sacrificial layer 1410 may determine the separation between subsequently formed bus line 1212 (FIG. 14) and/or 1213 (FIG. 14) and dielectric structure 104. In other words, the thickness of sacrificial layer 1410 may determine the width of sealed gaps 1850A (FIG. 14). In one example the thickness of sacrificial layer 1410 may be in the range of about 0.1 micron to about 3.0 microns.

After formation of sacrificial layer 1410, conductive material 1420 may be formed over sacrificial layer 1410 to eventually form bus lines 1212 (FIG. 14) and 1213 (FIG. 14). Bus line 1212 (FIG. 14) may be formed by partially or completely filling cavity 712 (FIG. 15) and bus line 1213 (FIG. 14) may be formed by partially or completely filling cavity 713 (FIG. 15). Conductive material for bus line 1212 (FIG. 14) and 1213 (FIG. 14) may be formed using deposition processes such as evaporation, sputtering, or chemical vapor deposition (CVD), plating or electroplating. The amount of conductive material that may need to be deposited is that sufficient to partially or fully fill cavities 712 (FIG. 15) and 713 (FIG. 15). In one example the thickness of conductive material 1420 may be sufficient to completely fill cavities 712 (FIG. 15) and 713 (FIG. 15). In another example conductive material 1420 may be sufficiently thick to completely fill cavities 712 (FIG. 15) and 713 (FIG. 15) and to extend above top surface 105 of substrate 110. In one example conductive material 1420 may extend above top surface 105 of substrate 110 by about 0.1 micron to about 4.0 microns.

In one example conductive material 1420 may comprise more than one material deposited sequentially, for example conductive material 1420 may comprise three layers of titanium/titanium nitride/tungsten. The Ti layer may act as an adhesion layer and may be in the range of about 100 Å to about 500 Å thick. The TiN layer may act as a barrier layer and may be in the range of about 200 Å to about 1000 Å thick. The final tungsten layer would then be deposited to partially or completely fill or overfill cavities 712 (FIG. 15) and 713 (FIG. 15). In the example shown in FIG. 16, conductive material 1420 has been deposited to a thickness to overfill cavities 712 (FIG. 15) and 713 (FIG. 15). The materials and dimensions given here are for one or more embodiments and are not a limitation of the claimed subject matter. Other dimensions may be used.

Figure 17:
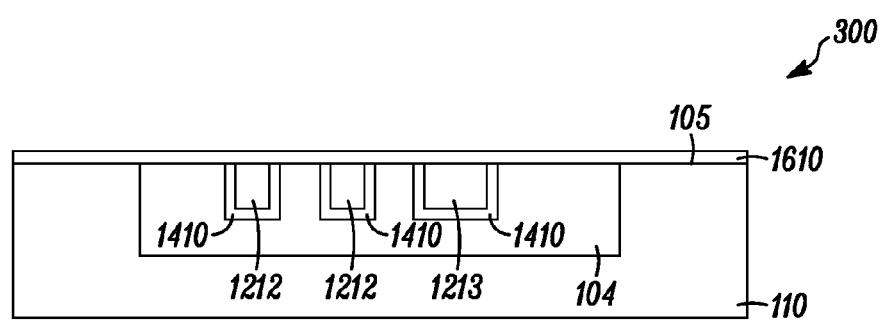
FIG. 17 is a cross-sectional view of the semiconductor structure of FIG. 16 at a later stage of fabrication.

FIG. 17 shows semiconductor structure 300 of FIG. 16 at a later stage of manufacture. After formation of conductive material 1420 (FIG. 16), excess conductive material 1420 (FIG. 16) may be removed to form bus lines 1212 and 1213. The top surface of bus lines 1212 and 1213 may range from below surface 105 of substrate 110 to coplanar or substantially coplanar with the surface 105 of substrate 110. In the example shown in FIGS. 14 and 17, the top surface of bus lines 1212 and 1213 is coplanar or substantially coplanar with surface 105 of substrate 110. Excess conductive material 1420 (FIG. 16) may be removed using wet chemical etching, dry (RIE) etching, chemical mechanical polishing (CMP) or a combination of these processes. Dielectric layers 510 and 512 (FIG. 16) may be optionally removed at this stage of the process. In one example dielectric layers 510 and 512 (FIG. 16) may be removed simultaneously with the removal of excess conductive material 1420 (FIG. 16). In the example shown in FIG. 17, dielectric layers 510 and 512 (FIG. 16) have been removed.

After removal of excess conductive material 1420 (FIG. 16) to form bus lines 1212 and 1213, dielectric layer 1610 may be formed over portions of substrate 110, dielectric structure 104, sacrificial material 1410 and bus lines 1212 and 1213. Dielectric layer 1610 may comprise dielectric materials such as silicon dioxide, silicon nitride, phosphorus silicate glass (PSG), boron phosphorus silicate glass (BPSG), an oxide formed using tetraethylorthosilicate (TEOS), or the like. In one example dielectric layer 1610 may comprise silicon dioxide formed by LPCVD deposition. In one example the thickness of dielectric layer 1610 may range from about 500 Å to about 2.0 microns. While dielectric layer 1610 shown in FIG. 17 is comprised of one layer, this is not a limitation of the claimed subject matter and dielectric layer 1610 may be comprised of more than one layer. In one example dielectric layer 1610 may comprise a material for which a selective etch exists relative to sacrificial material 1410. In other words, sacrificial material 1410 and dielectric layer 1610 are chosen such that when etching sacrificial material 1410, the etch rate of dielectric layer 1610 is relatively small compared to the etch rate of sacrificial material 1410. In one example the ratio of the etch rates between sacrificial material 1410 and dielectric layer 1610 is greater than 40; in another example this ratio is greater than 100.

Figure 18:
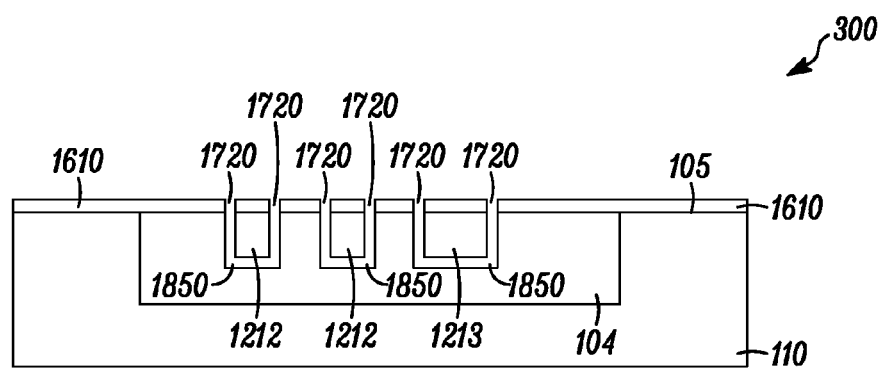
FIG. 18 is a cross-sectional view of the semiconductor structure of FIG. 17 at a later stage of fabrication.
Figure 19:
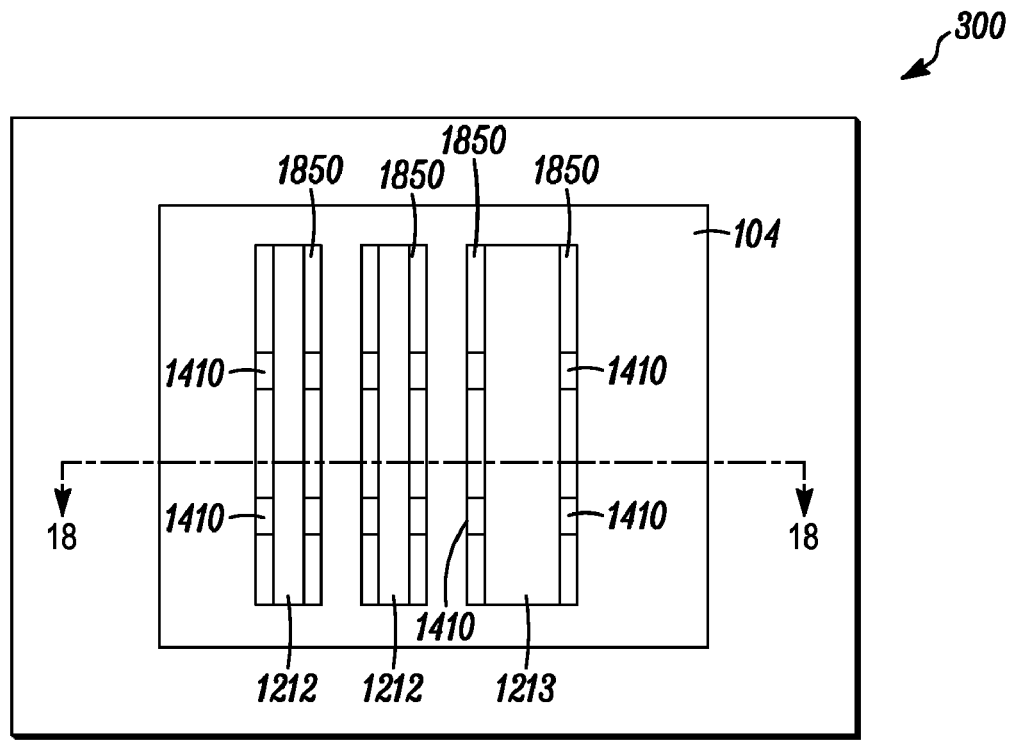
FIG. 19 is a plan view of the semiconductor structure of FIG. 18.

FIG. 18 shows semiconductor structure 300 of FIG. 17 at a later stage of manufacture. FIG. 19 shows a plan view of semiconductor structure 300 of FIG. 18. The cross-sectional view shown in FIG. 18 is taken along section lines 18-18 of FIG. 19. After formation of dielectric layer 1610, dielectric layer 1610 may be patterned using photolithography and etching processes to form openings 1720 to expose a portion of sacrificial layer 1410. Dielectric layer 1610 may be etched using a wet chemical etch or a dry etch process such as, for example, a reactive ion etch (RIE).

The width of openings 1720 may be in the range of about 0.1 microns to about 2 microns. In one example the width of openings 1720 may be in the range of about 0.1 microns to about 0.5 microns less than the width of sacrificial material 1410 (FIG. 17) at top surface 105 of substrate 110. The width of openings 1720 may be chosen to facilitate eventual sealing of these holes during formation of dielectric layer 1910 (FIG. 14). Although the width of openings 1720 shown in FIG. 18 is substantially the same, this is not a limitation of the claimed subject matter. The width of openings 1720 do not have to be the same, or substantially the same. Further, although openings 1720 are shown as rectangular, this is not a limitation of the claimed subject matter and openings 1720 may have any shape.

After formation of openings 1720 to expose sacrificial material 1410, sacrificial material 1410 may be partially or completely removed to form gaps 1850. Gap 1850 may also be referred to as a void, an air gap, a cavity an empty region, an empty space or the like. Sacrificial material 1410 may be removed using a vapor etch, a wet chemical etch, a dry reactive ion etch (RIE) or a combination of wet and dry etching. In the example shown in FIG. 18, in the plane of this cross-sectional view, sacrificial material 1410 has been completely removed surrounding bus lines 1212 and 1213 to form gaps 1850. As discussed above, gaps 1850 provides a further decrease in the dielectric constant of the volume surrounding bus lines 1212 and 1213, resulting in a reduction in parasitic capacitance and cross-talk.

Turning to FIG. 19, in one example gaps 1850 may not completely enclose bus lines 1212 and 1213. In the example shown in FIG. 19, gaps 1850 are separated by regions in which sacrificial material 1410 may not be removed. In this example remaining sacrificial material 1410 between gaps 1850 may be connected to bus lines 1212 and 1213 and connected to dielectric structure 104. In this example, remaining sacrificial material 1410 between gaps 1850 may act as a support for bus lines 1212 and 1213, to prevent them from twisting or bending. In one example the length of each gap 1850 may be in the range of about 25 microns to about 200 microns and the length of remaining sacrificial material 1410 between gaps 1850 may be in the range of about 1 microns to about 20 microns.

Figure 20:
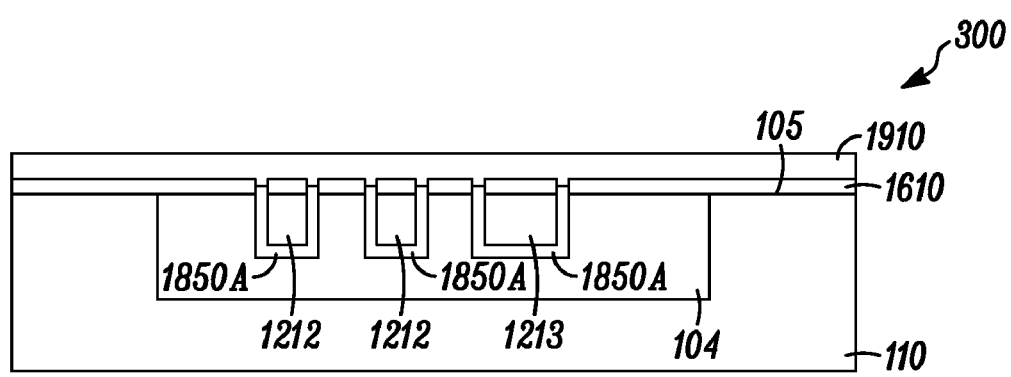
FIG. 20 is a cross-sectional view of the semiconductor structure of FIG. 18 at a later stage of fabrication.

Turning now to FIG. 20, FIG. 20 shows semiconductor structure 300 of FIG. 18 at a later stage of manufacture. After partial or complete removal of sacrificial material 1410, capping layer 1910 may be formed over dielectric layer 1610 and openings 1720 (FIG. 18) to form sealed gaps 1850A. In other words, when capped, gap 1850 is identified by reference number 1850A and may be referred to as sealed gap, sealed cavity, a sealed gap, a sealed void, a closed cell, closed cell void or the like.

In some embodiments, sealed gap 1850A may be evacuated to a pressure less than atmospheric pressure. In other words, the pressure in sealed gap 1850A may be below atmospheric pressure. As an example, the pressure in sealed gap 1850A may range from approximately 0.1 Torr to approximately 10 Torr. The type of substance or material within sealed gap 1850A is not a limitation of the claimed subject matter. For example, sealed gap 1850A may contain a gas, a fluid, or a solid matter.

Capping layer 1910 may comprise dielectric materials such as silicon dioxide, silicon nitride, phosphorus silicate glass (PSG), boron phosphorus silicate glass (BPSG), an oxide formed using tetraethylorthosilicate (TEOS), or the like. In one example capping layer 1910 may comprise silicon dioxide formed by LPCVD deposition. In one example the thickness of capping layer 1910 may range from about 0.2 microns to about 5 microns.

In some embodiments, because of the size of openings 1720 (FIG. 18), capping layer 1910 may enter into a portion of sealed gap 1850A, but not fill sealed gap 1850A, due in part to the relatively small size of the openings 1720 (FIG. 18).

While capping layer 1910 shown in FIG. 20 is comprised of one layer, this is not a limitation of the claimed subject matter and capping layer 1910 may be comprised of more than one layer. In one example an optional conformal sealing layer (not shown in FIG. 20) such as, for example, silicon nitride ($Si_3N_4$), may be formed on silicon dioxide layer 1910 to hermetically seal sealed gap 1850A. In other words, the optional conformal silicon nitride layer may fill in any openings or cracks in the silicon dioxide capping layer 1910, and in general prevent the propagation of gases or moisture into sealed gaps 1850A. In some embodiments, sealed gap 1850A may be multiple cavities that are physically isolated from each other, as shown in FIG. 20. Accordingly, if capping layer 1910 experiences a rupture or fracture, this rupture or fracture is contained in a limited area so that any external contamination that propagates into sealed gap 1850A through the rupture or fracture may be contained in a limited area due to the physical isolation of the multiple cavities from each other.

In addition to sealing gaps 1850 (FIG. 18), capping layer 1910 may also serve as a protective layer for dielectric structure 104 and bus lines 1212 and 1213 during subsequent fabrication of active devices.

Figure 21:
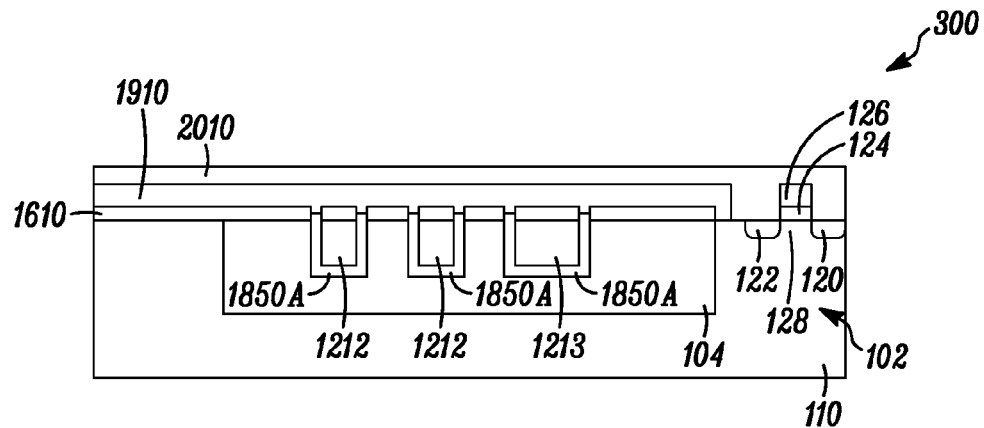
FIG. 21 is a cross-sectional view of the semiconductor structure of FIG. 20 at a later stage of fabrication.

Turning now to FIG. 21, FIG. 21 shows semiconductor structure 300 of FIG. 20 at a later stage of manufacture. After formation of capping layer 1910, active devices may be formed in portions of substrate 110 using conventional techniques.

As seen in FIG. 21, FET 102 may be formed in active region 21. After formation of active devices, dielectric layer 2010 may be formed over active region 21 and capping layer 1920. Dielectric layer 2010 may comprise dielectric materials such as silicon dioxide, silicon nitride, phosphorus silicate glass (PSG), boron phosphorus silicate glass (BPSG), an oxide formed using tetraethylorthosilicate (TEOS), or the like. In one example dielectric layer 2010 may comprise silicon dioxide formed by PECVD deposition. In one example the thickness of dielectric layer 2010 may range from about 0.2 microns to about 5 microns. While dielectric layer 2010 shown in FIG. 21 is comprised of one layer, this is not a limitation of the claimed subject matter and dielectric layer 2010 may be comprised of more than one layer.

After formation of dielectric layer 2010, processing similar to that described in the above example may be performed to form interconnects 1350 (FIG. 14) resulting in semiconductor structure 300 shown in FIG. 14. In short this may comprise patterning using photolithography and etching dielectric layer 2010, dielectric layer 1910 and dielectric layer 1610 to form openings to expose bus line 1212 and 1213 and drain 122 of FET 102 followed by deposition and patterning of conductive material to form interconnects 1350, as shown in FIG. 14.

Figure 22:
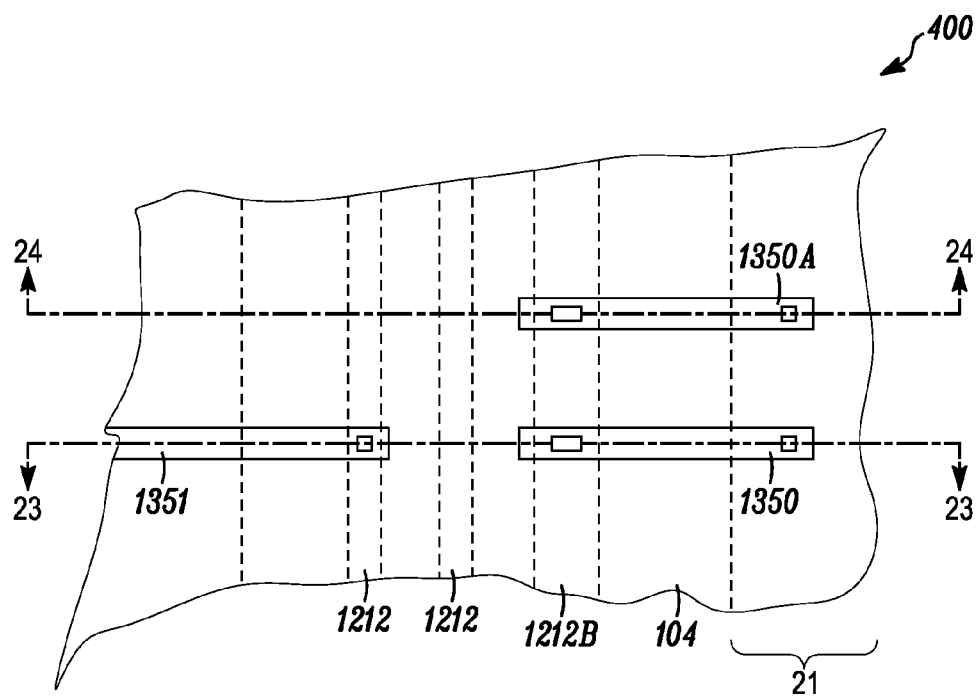
FIG. 22 is a plan view of another semiconductor structure in accordance with an embodiment.
Figure 23:
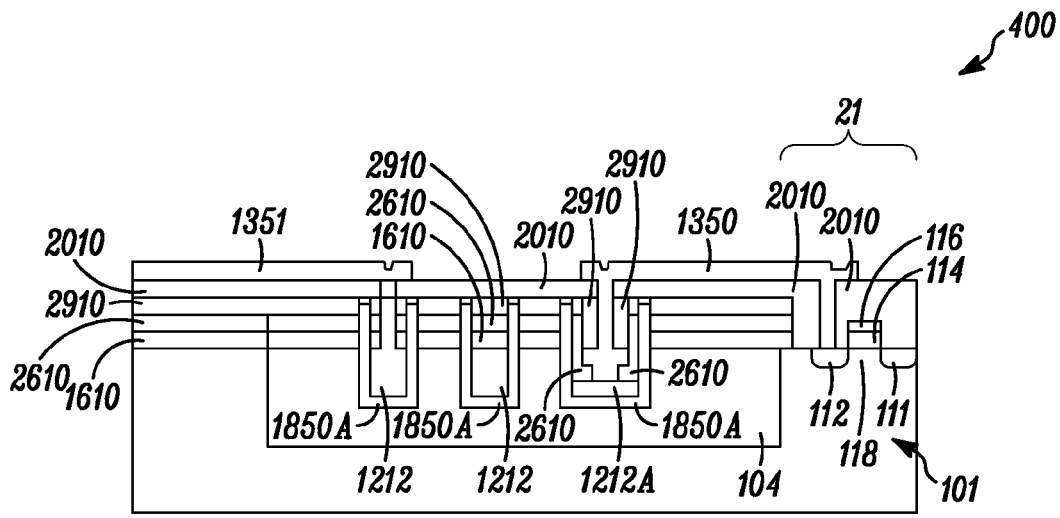
FIG. 23 is a cross-sectional view of the semiconductor structure of FIG. 22 taken along section line 23-23 of FIG. 22.
Figure 24:
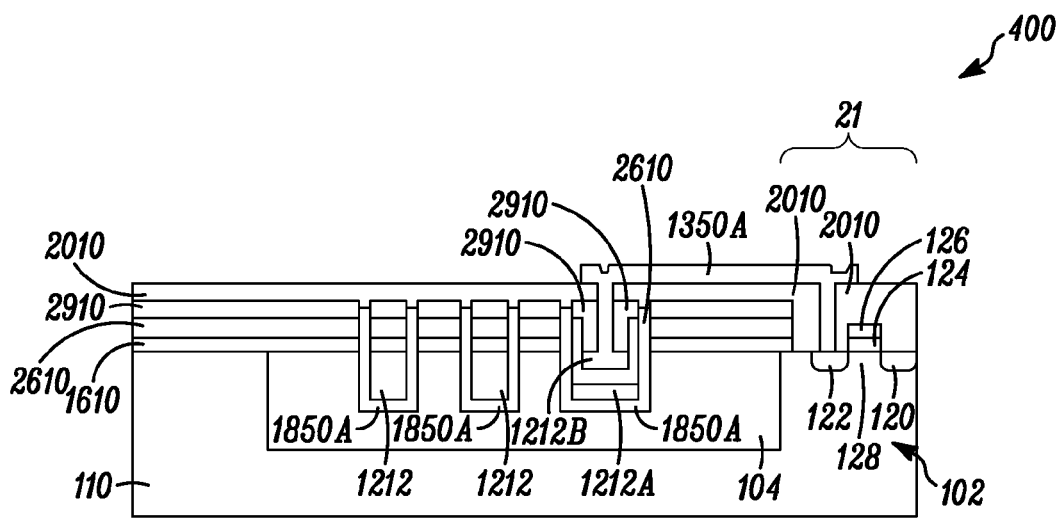
FIG. 24 is a cross-sectional view of the semiconductor structure of FIG. 22 taken along section line 24-24 of FIG. 22.

In the examples described above, one bus line is shown in each cavity. However this is not a limitation of the claimed subject matter, and a plurality of bus lines may be formed in a single cavity. In this case, each bus line may be contacted separately. FIGS. 22-24 show an example of one or more embodiments comprising a two-level bus line. FIG. 22 shows a plan view of semiconductor structure 400, FIG. 23 shows a cross-sectional view of semiconductor structure 400 in FIG. 22 taken along section line 23-23 and FIG. 24 shows a cross sectional view of semiconductor structure 400 in FIG. 22 taken along section line 24-24.

Turning first to FIG. 24, bus line 1212B may be formed over bus line 1212A and may be separated from bus line 1212B by dielectric layer 2610. Bus line 1212B may be coupled to interconnect 1350A and bus line 1212A may be coupled to interconnect 1350 (FIG. 23). That is, at section line 23-23 shown in FIG. 23, interconnect 1350 may be coupled to bottom bus line 1212A and at section line 24-24 shown in FIG. 24 interconnect 1350A may be coupled to top bus line 1212B. Although two vertically stacked bus lines are shown in the example in FIGS. 22-24, this is not a limitation of the claimed subject matter and two or more bus lines may be formed in a single cavity by stacking them either vertically or horizontally.

Turning now to FIG. 22, bus lines 1212 and 1212B are shown with dashed lines, indicating that they are beneath the surface. Bus line 1212A is not shown in FIG. 22 because it is underneath bus line 1212B. The outline of dielectric structure 104 is also shown with dashed lines, again indicating that it is below the surface. Interconnect 1351 may couple to bus line 1212; the other end of interconnect 1351 is not shown in FIG. 22.

Field effect transistor (FET) 101 and FET 102 may be formed in active region 21. FET 101 may be a MOSFET and may include a source region 110 in a portion of substrate 111, a drain region 112 in a portion of substrate 110, a gate oxide 114 over a portion of substrate 110, a gate 116 over gate oxide 114, and a channel region 118 formed in a portion of substrate 110 under gate oxide 114 and between doped regions 110 and 112. FET 102 may be formed in active region 21 and may be a MOSFET and may include a source region 120 in a portion of substrate 110, a drain region 122 in a portion of substrate 110, a gate oxide 124 over a portion of substrate 110, a gate 126 over gate oxide 124, and a channel region 128 formed in a portion of substrate 110 under gate oxide 124 and between doped regions 120 and 122. In one example drain 112 (FIG. 23) of FET 101 may be coupled to interconnect 1350 and drain 122 (FIG. 24) of FET 102 may be coupled to interconnect 1350A. In this example active region 21 may contain two FETs, however this is not a limitation of the claimed subject matter and in other embodiments there may be more than one active region and each active region may contain one or more active devices.

Turning now to FIG. 23, a portion of bus line 1212B (FIG. 24) over bus line 1212A may be removed to provide access to bus line 1212A and bus line 1212A may be coupled to interconnect 1350.

Figure 25:
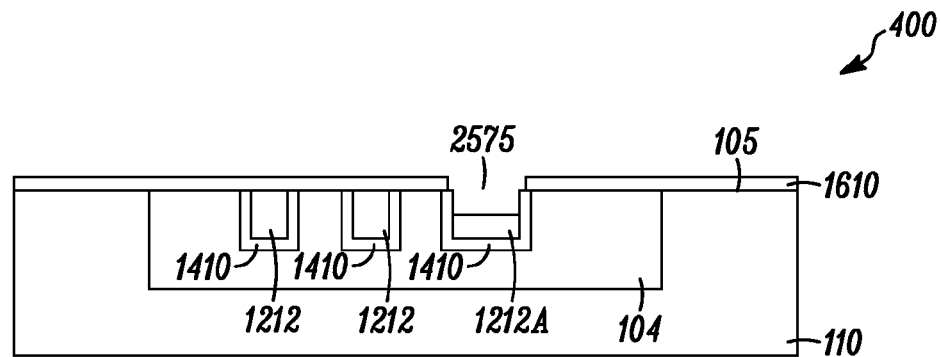
FIG. 25 is a cross-sectional view of the semiconductor structure of FIG. 24 an early stage of fabrication.

FIGS. 25-31 illustrate one embodiment for making semiconductor structure 400 of FIGS. 22-24. FIG. 25 shows semiconductor structure 300 of FIG. 14 at an early stage of manufacture. The process to fabricate the structure at the stage shown in FIG. 25 may start at the same stage as that of semiconductor structure 300 shown in FIG. 17.

FIG. 25 shows semiconductor structure 300 of FIG. 17 at a later stage of manufacture. After formation of dielectric layer 1610, dielectric layer 1610 may be patterned using photolithography and etching processes to form opening 2575 to expose bus line 1213 (FIG. 17). Dielectric layer 1610 may be etched using a wet chemical etch or a dry etch process such as, for example, a reactive ion etch (RIE).

After formation of opening 2575 to bus line 1213 (FIG. 17), bus line 1213 (FIG. 17) may be partially removed to form bus line 1212A. A portion of bus line 1213 (FIG. 17) may be removed using a wet chemical, a dry reactive ion etch (RIE) or a combination of wet and dry etching. In one example the vertical thickness of bus line 1212A after etching may be in the range of about 20% to about 80% of the depth of cavity 713 (FIG. 15).

Figure 26:
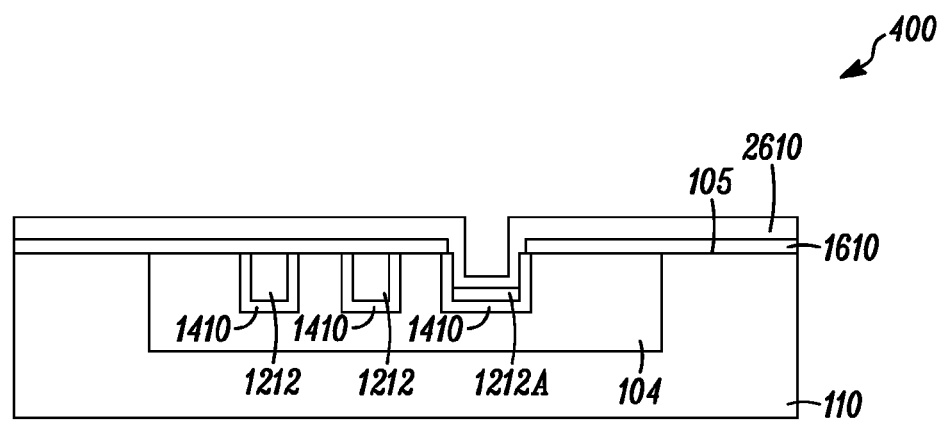
FIG. 26 is a cross-sectional view of the semiconductor structure of FIG. 25 at a later stage of fabrication.

Turning now to FIG. 26, FIG. 26 shows semiconductor structure 400 of FIG. 25 at a later stage of manufacture. After formation of opening 2575 dielectric layer 2610 may be formed over dielectric layer 1610, a portion of sacrificial material 1410 and bus line 1212A.

Dielectric layer 2610 may comprise dielectric materials such as silicon dioxide, silicon nitride, phosphorus silicate glass (PSG), boron phosphorus silicate glass (BPSG), an oxide formed using tetraethylorthosilicate (TEOS), or the like. In one example dielectric layer 2610 may comprise silicon dioxide formed by LPCVD deposition. In one example the thickness of dielectric layer 2610 may range from about 0.1 microns to about 2 microns.

Figure 27:
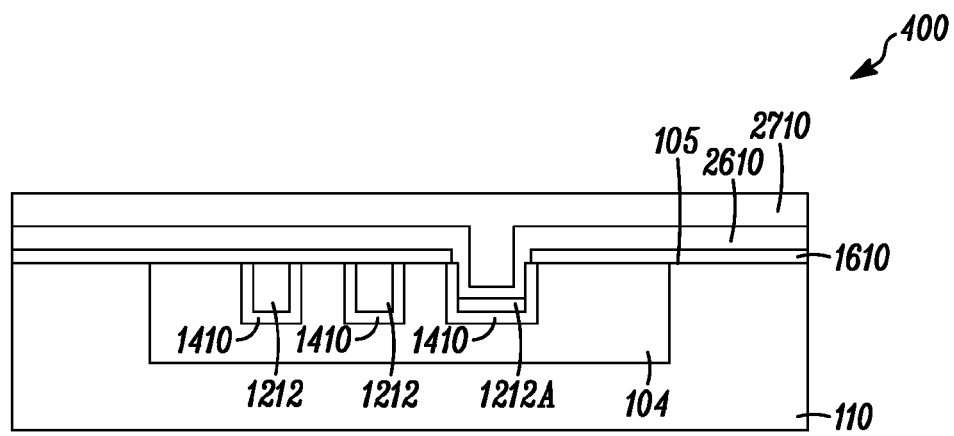
FIG. 27 is a cross-sectional view of the semiconductor structure of FIG. 26 at a later stage of fabrication.

Turning now to FIG. 27, FIG. 27 shows semiconductor structure 400 of FIG. 26 at a later stage of manufacture. After formation of dielectric layer 2610, conductive material 2710 may be formed over dielectric layer 2610. Conductive material 2710 may be subsequently patterned to become bus line 1212B (FIG. 24).

In one example conductive material 2710 may comprise the same material used to form bus line 1212A, although this is not a limitation of the claimed subject matter and in some embodiments bus line 1212A may be formed of a different material than bus line 1212B. Conductive material 2710 may be formed to a thickness such that the top surface of conductive material 2710 over bus line 1212A is coplanar or substantially coplanar with surface 105 of substrate 110.

Figure 28:
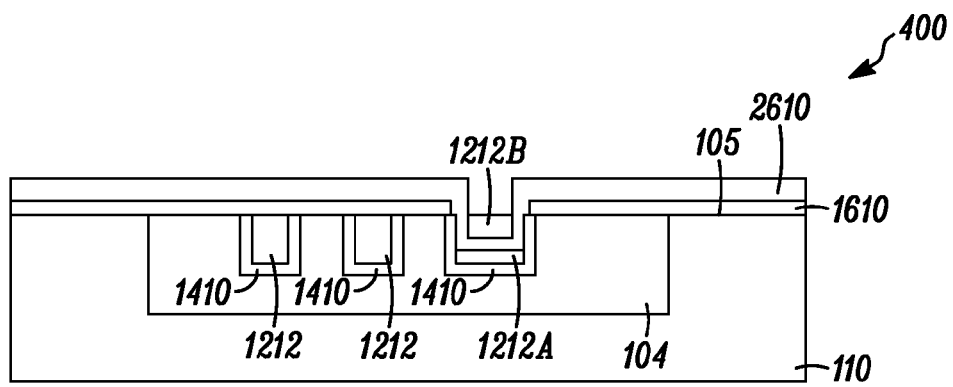
FIG. 28 is a cross-sectional view of the semiconductor structure of FIG. 27 at a later stage of fabrication.

FIG. 28 shows semiconductor structure 400 of FIG. 27 at a later stage of manufacture. After formation of conductive material 2710 (FIG. 27), excess conductive material 2710 (FIG. 27) may be removed to form bus line 1212B. The surface of bus line 1212B may range from below surface 105 of substrate 110 to coplanar or substantially coplanar with the surface 105 of substrate 110. In the example shown in FIG. 28, the surface of bus line 1212B is coplanar or substantially coplanar with surface 105 of substrate 110. Excess conductive material 2710 (FIG. 27) may be removed using wet chemical etching, dry (RIE) etching, chemical mechanical polishing (CMP) or a combination of these processes.

Figure 29:
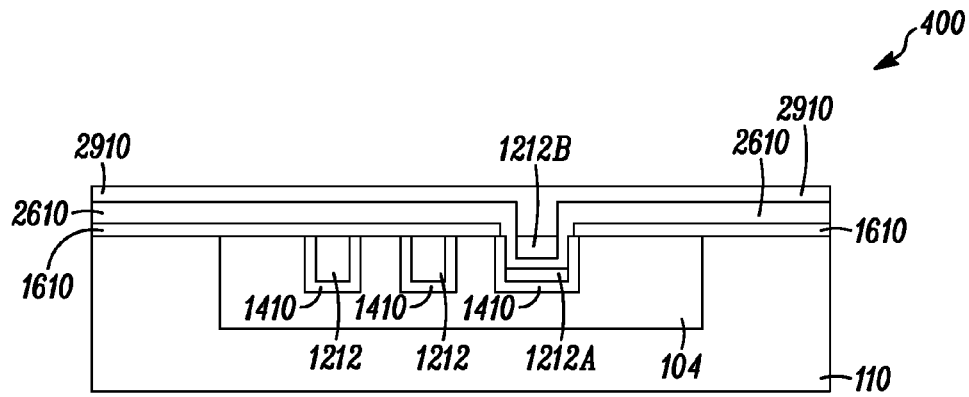
FIG. 29 is a cross-sectional view of the semiconductor structure of FIG. 28 at a later stage of fabrication.

Turning now to FIG. 29, FIG. 29 shows semiconductor structure 400 of FIG. 28 at a later stage of manufacture. After formation of bus line 1212B dielectric layer 2910 may be formed over dielectric layer 2610 and bus line 1212B.

Dielectric layer 2910 may comprise dielectric materials such as silicon dioxide, silicon nitride, phosphorus silicate glass (PSG), boron phosphorus silicate glass (BPSG), an oxide formed using tetraethylorthosilicate (TEOS), or the like. In one example dielectric layer 2910 may comprise silicon dioxide formed by LPCVD deposition. In one example the thickness of dielectric layer 2910 may range from about 0.1 microns to about 2 microns.

Figure 30:
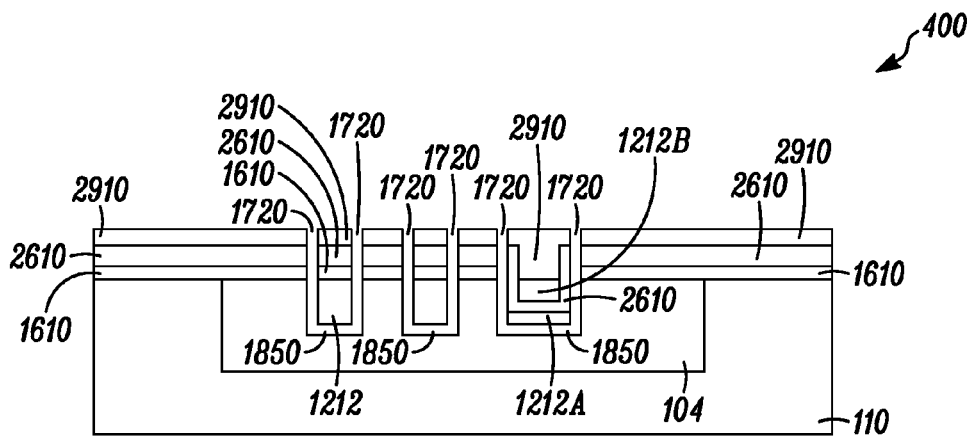
FIG. 30 is a cross-sectional view of the semiconductor structure of FIG. 29 at a later stage of fabrication.

Turning now to FIG. 30, FIG. 30 shows semiconductor structure 400 of FIG. 29 at a later stage of manufacture. After formation of dielectric layer 2910, dielectric layer 2910, dielectric layer 2610 and dielectric layer 1610 may be patterned using photolithography and etching processes to form openings 1720 to expose a portion of sacrificial layer 1410. Dielectric layers 2910, 2610 and 1610 may be removed using one or more processes. In one example, dielectric layers 2910, 2610 and 1610 may be etched using a wet chemical etch or a dry etch process such as, for example, a reactive ion etch (RIE). This process is similar to that described above with reference to FIG. 18.

After formation of openings 1720 to expose sacrificial material 1410, sacrificial material 1410 may be partially or completely removed to form gaps 1850. Gap 1850 may also be referred to as a void, an air gap, a cavity an empty region, an empty space or the like. Sacrificial material 1410 may be removed using a vapor etch, a wet chemical etch, a dry reactive ion etch (RIE) or a combination of wet and dry etching.

As discussed above, gaps 1850 provides a further decrease in the dielectric constant of the volume surrounding bus lines 1212, 1212A and 1212B, resulting in a reduction in parasitic capacitance and cross-talk. This process is similar to that described above with reference to FIG. 18. Although not shown, openings 1720 can be sealed using a nonconformal material such as, for example, oxide, nitride, TEOS oxide, or PSG, formed using PECVD.

After formation of gaps 1850, processing similar to that described in the above example with reference to FIGS. 20-21 may be performed to form active devices and interconnects resulting in semiconductor structure 400 shown in FIGS. 22-24.

During fabrication of the structures of one or more embodiments, the oxidation process to form dielectric material 104 may induce stress in the semiconductor structure. Stress may be induced in the structure as a result of the 2.2× volume expansion that occurs when silicon is oxidized. Stress may have an adverse effect on the performance of active devices. For example stress may result in the formation of dislocations or defects which may cause excessive leakage current. This stress may be partially or substantially removed in a portion or all of the semiconductor structure through the addition of a stress relief trench.

Figure 31:
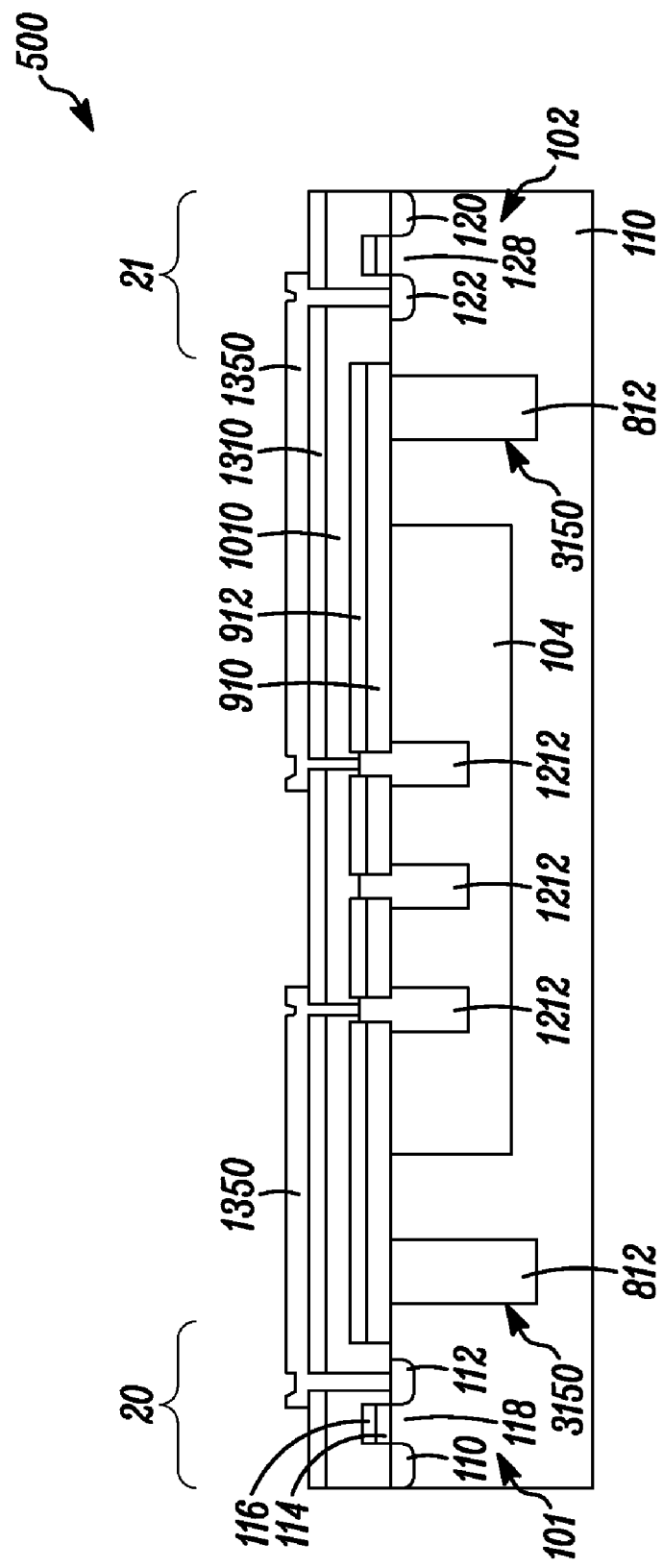
FIG. 31 is a cross-sectional view of another semiconductor structure; in accordance with an embodiment.

FIG. 31 shows semiconductor structure 500 which may incorporate a stress relief trench 3150. Semiconductor structure 500 is similar to that of semiconductor structure 200 shown in FIG. 4. In some embodiments stress relief trench 3150 may partially or substantially reduce the stress in semiconductor material 110 outside of dielectric structure 104. Stress relief trench 3150 may be formed before or after the formation of dielectric structure 104 in FIG. 7. In the example shown in FIG. 31 stress relief trench 3150 may be formed after formation of dielectric material 104. Stress relief trench 3150 may be filled with sacrificial material 812, as shown in the example in FIG. 31. However this is not a limitation of the claimed subject matter and stress relief trench 3150 may be filled with any other material, for example a dielectric or a polymer, and in general may contain a gas, a fluid or a solid matter. In some embodiments, stress relief trench 3150 may be at least partially empty and may be evacuated to a pressure less than atmospheric pressure. In other words, the pressure in stress relief trench 3150 may be below atmospheric pressure. As an example, the pressure in stress relief trench 3150 range from approximately 0.1 Torr to approximately 10 Torr.

Accordingly, various structures and methods have been disclosed to provide a relatively thick, embedded dielectric region that may be a dielectric support structure capable of supporting one or more passive devices and in which interconnects may be embedded. In various embodiments, the disclosed semiconductor structure may provide electrical isolation, reduce parasitic substrate capacitance, allow for the formation of passive devices having a relatively high quality factor (Q), and enable relatively higher frequency of operation of any devices formed using, or in conjunction with, a structure that includes the disclosed dielectric structure. In addition, the disclosed dielectric structure and the methods for making the dielectric structure may enable relatively lower interconnect resistance, relatively lower crosstalk between interconnects and between interconnects and other active and/or passive devices, relatively lower parasitic capacitance and may enable relatively higher frequency of operation of any devices formed using, or in conjunction with, a structure that includes the disclosed dielectric structure.

Although specific embodiments have been disclosed herein, it is not intended that the claimed subject matter be limited to the disclosed embodiments. Those skilled in the art will recognize that modifications and variations can be made without departing from the spirit of the claimed subject matter. It is intended that the claimed subject matter encompass all such modifications and variations as fall within the scope of the appended claims.

What is claimed is:

1. A semiconductor structure, comprising:
   an electrical bus embedded in a dielectric material disposed at least partially below a surface of a semiconductor substrate;
   an active region disposed external to the dielectric material;
   an electrical interconnect at least partially disposed external to the dielectric material to electrically couple the active region with the electrical bus embedded in the dielectric material; and
   a stress relief trench disposed in the semiconductor substrate at least partially disposed between the active region and the dielectric material.

2. The structure of claim 1, wherein the electrical bus extends at least two microns below the surface of the semiconductor substrate.

3. The structure of claim 1, wherein the electrical bus has a width of at least one micron.

4. The structure of claim 1, wherein the electrical bus comprises two electrical conductors spaced at least two microns apart.

5. The structure of claim 1, wherein the dielectric material surrounding the electrical bus has a width of at least one micron.

6. The structure of claim 1, wherein the dielectric material surrounding the electrical bus extends at least 0.5 micron below the bottom of the electrical bus.

7. The structure of claim 1, further comprising:
   a second electrical interconnect;
   a circuit element coupled to the electrical bus through the second electrical interconnect above the surface of the semiconductor substrate, the circuit element comprising at least one or more passive devices.

8. The structure of claim 1, further comprising one or more active circuit elements, wherein the dielectric material surrounds or partially surrounds the one or more active circuit elements.

9. The structure of claim 1, wherein a portion of the electrical bus is separated from the dielectric material by a gap.

10. The structure of claim 9, wherein a pressure in the gap is below atmospheric pressure.

11. The structure of claim 10, wherein the gap has a width of at least about 0.1 micron.

12. The structure of claim 1, wherein the electrical bus comprises a first electrical conductor and a second electrical conductor, the second electrical conductor formed over the first electrical conductor and separated from the first electrical conductor by a second dielectric material.

13. The structure of claim 1, wherein the dielectric material comprises silicon dioxide.

14. The structure of claim 1, wherein the electrical bus comprises aluminum.

\* \* \* \* \*